United States Patent
Huang et al.

(10) Patent No.: US 7,605,614 B2
(45) Date of Patent: Oct. 20, 2009

(54) BULK INPUT CURRENT SWITCH LOGIC CIRCUIT

(75) Inventors: Hong-Yi Huang, Taipei (TW); Chun-Tsai Hung, Changhua County (TW); Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/141,112

(22) Filed: Jun. 18, 2008

(65) Prior Publication Data

US 2009/0212822 A1    Aug. 27, 2009

(30) Foreign Application Priority Data

Feb. 27, 2008    (TW) .............................. 97106922 A

(51) Int. Cl.
*H03K 19/094* (2006.01)

(52) U.S. Cl. ..................................................... 326/115

(58) Field of Classification Search .................. 326/115
See application file for complete search history.

(56) References Cited

U.S. PATENT DOCUMENTS 5,042,011 A * 8/1991 Casper et al. ............... 365/205
2007/0057698 A1 * 3/2007 Verbauwhede et al. ........ 327/52

OTHER PUBLICATIONS

Article titled "Differential Current Switch Logic: A Low Power DCVS Logic Family" authored by Somasekhar et al., IEEE Journal Solid-State Circuits, vol. 31, No. 7, Jul. 1996 pp. 981-991.
Article titled "Custom and Semi-Custom Design Techniques" authored by Heller et al., ISSCC 84 / Wednesday, Feb. 22, 1984 / Continental Ballrooms 1-4 / 10:00 A.M. pp. 16-17.
Article titled "A Comparison of CMOS Circuit Techniques: Differential Cascode Voltage Switch Logic Versus Conventional Logic" authored by Chu et al., IEEE Journal of Solid-Stage Circuits, vol. SC-22, No. 4, Aug. 1987 pp. 528-532.
Article titled "Design Procedures for Differential Cascode Voltage Swith Circuits" authored by Chu et al., IEEE Journal of Solid-State Circuits, vol. SC-21, No. 6, Dec. 1986 pp. 1082-1087.

* cited by examiner

*Primary Examiner*—James H. Cho
*Assistant Examiner*—Thienvu V Tran
(74) *Attorney, Agent, or Firm*—Jianq Chyun IP Office

(57) ABSTRACT

A current switch logic circuit is disclosed. The circuit includes a current sense amplifier formed by a first transistor to a fifth transistor, and a logic tree. The logic tree is used to generate a first current and a second current. The current sense amplifier generates a first output signal and a second output signal according to the first current and the second current.

24 Claims, 27 Drawing Sheets

BULK INPUT CURRENT SWITCH LOGIC CIRCUIT

CROSS-REFERENCE TO RELATED APPLICATION

This application claims the priority benefit of Taiwan application serial no. 97106922, filed on Feb. 27, 2008. The entirety of the above-mentioned patent application is hereby incorporated by reference herein and made a part of this specification.

BACKGROUND OF THE INVENTION

1. Field of the Invention

The present invention relates to a logic circuit structure. More particularly, the present invention relates to a bulk input current switch logic circuit.

2. Description of Related Art

As functions of electronic products trend to be more complicated, digital logic circuits become favorite choices for designers. Moreover, with quick development of process capability, nanometer process is implemented. In this case, processing technique originally bottlenecked development of digital circuits is now no longer the biggest problem, instead, it is the transmission speed of a conventional logic gate circuit that limits a whole circuit performance thereof.

FIG. 1 illustrates a circuit diagram of a 3-input NOR gate circuit of a conventional static logic circuit. For such conventional logic gate circuit, if input terminals A~C are all level "0", three P-type transistors are then turned on, so that an output $V_O$ has a high level "1". If at least one of the input terminals A~C has the high level "1", at least one N-type transistor is then turned on; so that the output $V_O$ has a low level "0". Since such logic circuit requires a set of serially connected P-type transistors (or N-type transistors), the more the input terminals are, during one output transition, the more the transistors required to be turned on.

FIG. 2 illustrates a circuit diagram of a 2-input NAND gate circuit of a conventional dynamic logic circuit. Such conventional dynamic logic circuit requires a pre-charge enable signal ϕ. Wherein, when the pre-charging enable signal ϕ has the low level "0", the output $V_O$ may be pre-charged to the high level "1". When the pre-charge enable signal ϕ is transited to the high level "1", the output $V_O$ is then determined according to levels of the input B and input C. If the input B and the input C are all the high level "1", the output $V_O$ is then lowered to the level "0" due to turning on of the transistor. Conversely, if at least one of the input B and the input C is not the high level "1", the output $V_O$ is then maintained to be the high level "1".

Next, referring to FIGS. 3A and 3B, FIG. 3A is a circuit diagram illustrating a conventional N-type transistor differential logic circuit. FIG. 3B is an sample diagram of a logic unit 310 of FIG. 3A. Such conventional logic circuit may implement a differential input via input A, input B or input C, and inverted signal input $\overline{A}$, input $\overline{B}$ or input $\overline{C}$. In coordination with a conventional technique of the dynamic logic circuit, a pre-charge phase is controlled via the pre-charge enable signal ϕ. Moreover, the conventional logic circuit may further include a latch circuit (in coordination with a transistor MP1 of an output Q, or a transistor MP2 of an output $\overline{Q}$) for further stabilizing the output of the circuit. However, the differential logic circuit also requires a set of serially connected transistor in case of multiple inputs.

FIG. 4 is a circuit diagram illustrating a conventional bulk input differential logic circuit. Referring to FIG. 4, via a current sense amplifier composed of transistors M2, M3, M5 and M7, such conventional logic circuit may sense a current $I_L$ generated by transistors $M_{41}$~$M_{4n}$, connected in parallel, and sense a current $I_R$ generated by transistors $M_{81}$~$M_{8n}$, connected in parallel, and meanwhile generate the output Q and the $\overline{Q}$ output according to the sensing results. The pre-charge enable signal ϕ and the transistors M1 and M6 respectively provide a pre-charge signal and a pre-charge path. The transistor M9 provides a ground voltage during a non pre-charge period. Regardless of the number of the input terminals, such conventional logic circuit only has 3 serially connected N-type transistors, and therefore a response speed of the circuit may be effectively improved.

SUMMARY OF THE INVENTION

Accordingly, the present invention is directed to a bulk input current switch logic circuit for providing a high speed and low power logic circuit in case of multiple logic input signals.

The present invention is directed to a variation of a bulk input current switch logic circuit for providing a high speed and low power logic circuit in case of multiple logic input signals.

The present invention provides a bulk input current switch logic circuit including a current sense amplifier and a logic tree. The current sense amplifier includes a first transistor to a fourth transistor. A first source/drain of the first transistor is coupled to a first voltage, a gate thereof is coupled to a first output terminal, and a second source/drain thereof is coupled to a second output terminal. A first source/drain of the second transistor is coupled to the first voltage, a gate thereof is coupled to the second output terminal, and a second source/drain thereof is coupled to the first output terminal. A first source/drain of the third transistor is coupled to the second output terminal, and a gate thereof is coupled to one of a pre-charge enable terminal and the first output terminal. A first source/drain of the fourth transistor is coupled to the first output terminal, and a gate thereof is coupled to one of the pre-charge enable terminal and the second output terminal.

Moreover, the logic tree is coupled between the second source/drain of the third transistor and the second source/drain of the fourth transistor. The logic tree has a first control terminal and a second control terminal, wherein the second control terminal is coupled to one of the pre-charge enable terminal and the first output terminal, and the first control terminal is coupled to one of the pre-charge enable terminal and the second output terminal. The logic tree is used for generating a first current and a second current.

The present invention provides another bulk input current switch logic circuit similarly including a current sense amplifier and a logic tree. The current sense amplifier includes a first transistor to a fourth transistor. A first source/drain of the first transistor is coupled to a first voltage, a gate thereof is coupled to a first output terminal, and a second source/drain thereof is coupled to a second output terminal. A first source/drain of the second transistor is coupled to the first voltage, a gate thereof is coupled to a second output terminal, and a second source/drain thereof is coupled to the first output terminal. A gate of the third transistor is coupled to one of a pre-charge enable terminal and the first output terminal, and a second source/drain thereof is coupled to a second voltage. A gate of the fourth transistor is coupled to one of the pre-charge enable terminal and the second output terminal, and a second source/drain thereof is coupled to the second voltage.

The logic tree is coupled between the first source/drain of the third transistor, the first source/drain of the fourth transistor, the first output terminal and the second output terminal.

The logic tree has a first control terminal and a second control terminal, wherein the second control terminal is coupled to one of the pre-charge enable terminal and the first output terminal, and the first control terminal is coupled to one of the pre-charge enable terminal and the second output terminal. The logic tree is used for generating a first current and a second current.

In the present invention, based on bulk inputting and in coordination with the current latch sense amplifier, all the devices may be connected parallel to generate complementary outputs and avoid direct current power consumption. Moreover, response speed of the current latch sense amplifier is quite high. Therefore, power consumption thereof may be effectively decreased, and working speed may be effectively improved.

In order to make the aforementioned embodiment accompanied with figures is described in detail below.

DESCRIPTION OF EMBODIMENTS

Figure 1:
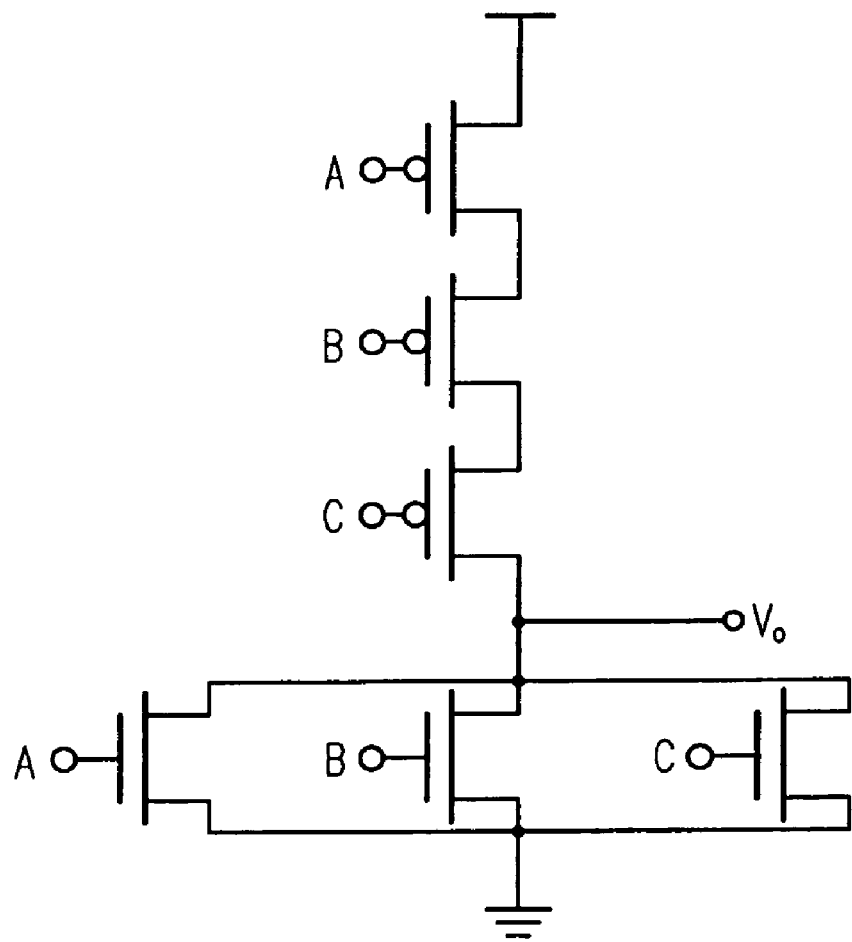
FIG. 1 is a circuit diagram illustrating a 3-input NOR gate circuit of a conventional static logic circuit.
Figure 2:
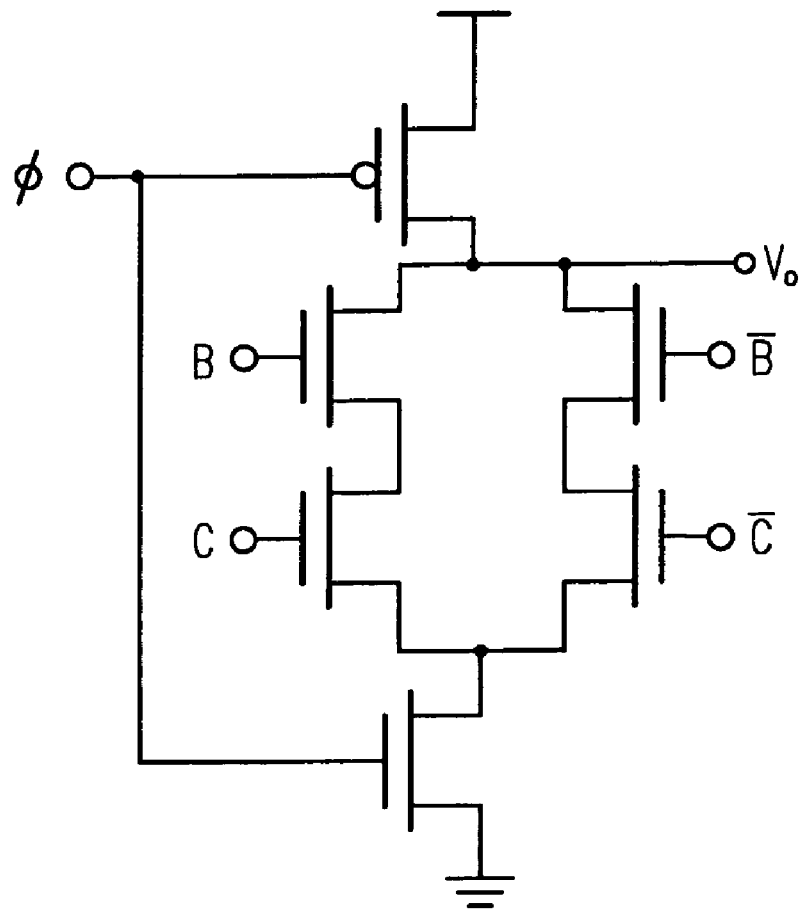
FIG. 2 is a circuit diagram illustrating a 2-input NAND gate circuit of a conventional dynamic logic circuit.
Figure 3A:
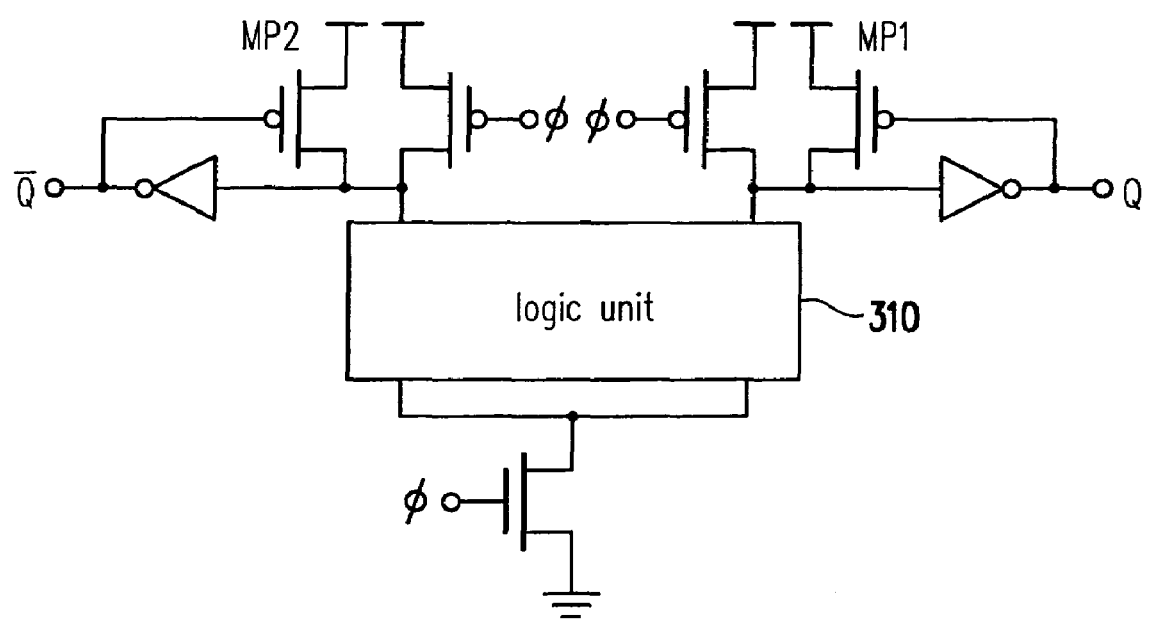
FIG. 3A is a circuit diagram illustrating a conventional N-type transistor differential logic circuit.
Figure 3B:
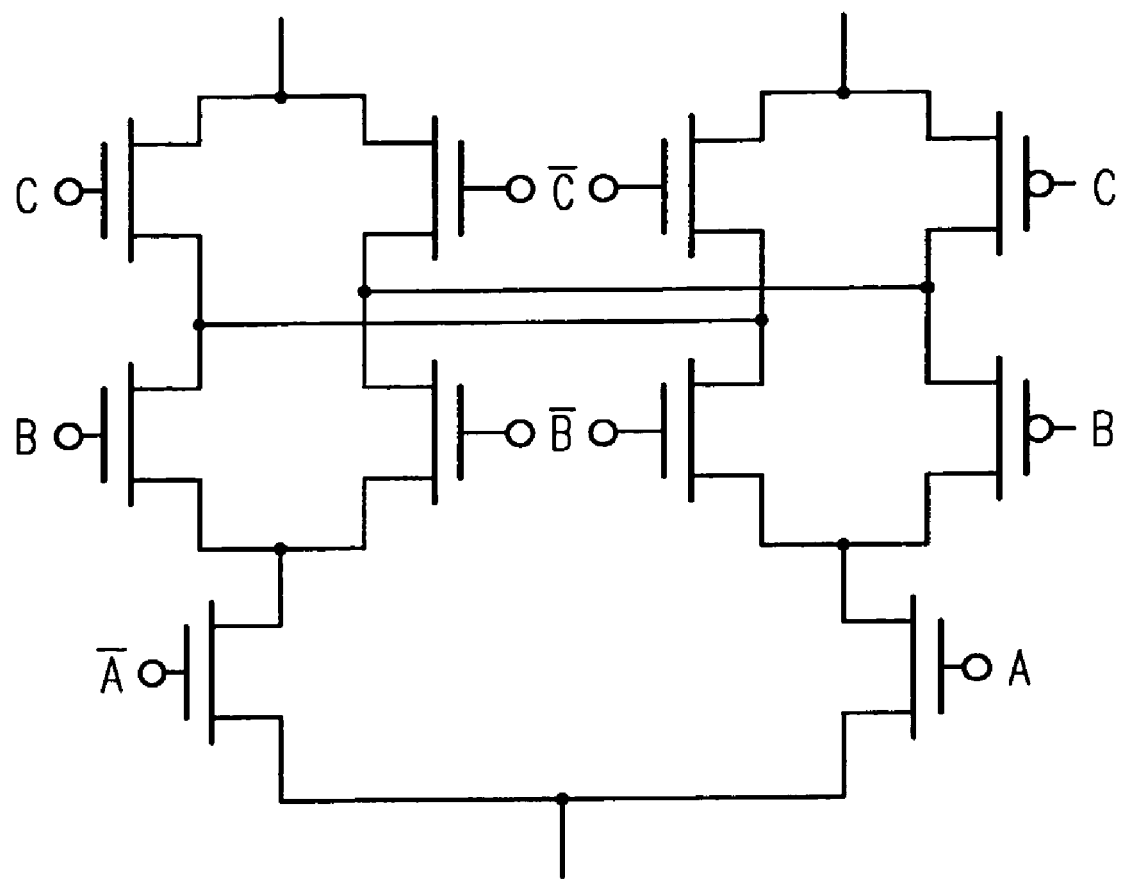
FIG. 3B is an sample diagram of a logic unit of FIG. 3A.
Figure 4:
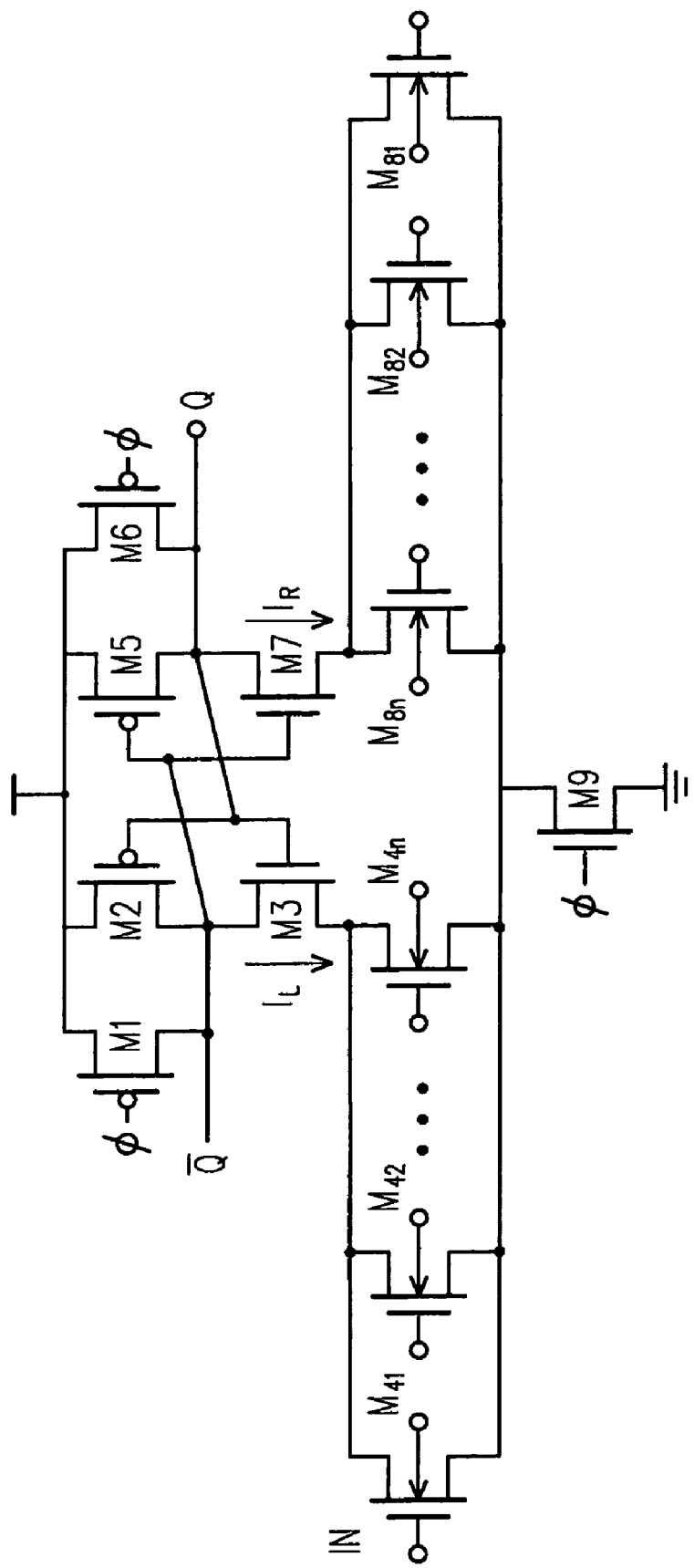
FIG. 4 is a circuit diagram illustrating a conventional bulk input differential logic circuit.
Figure 5A:
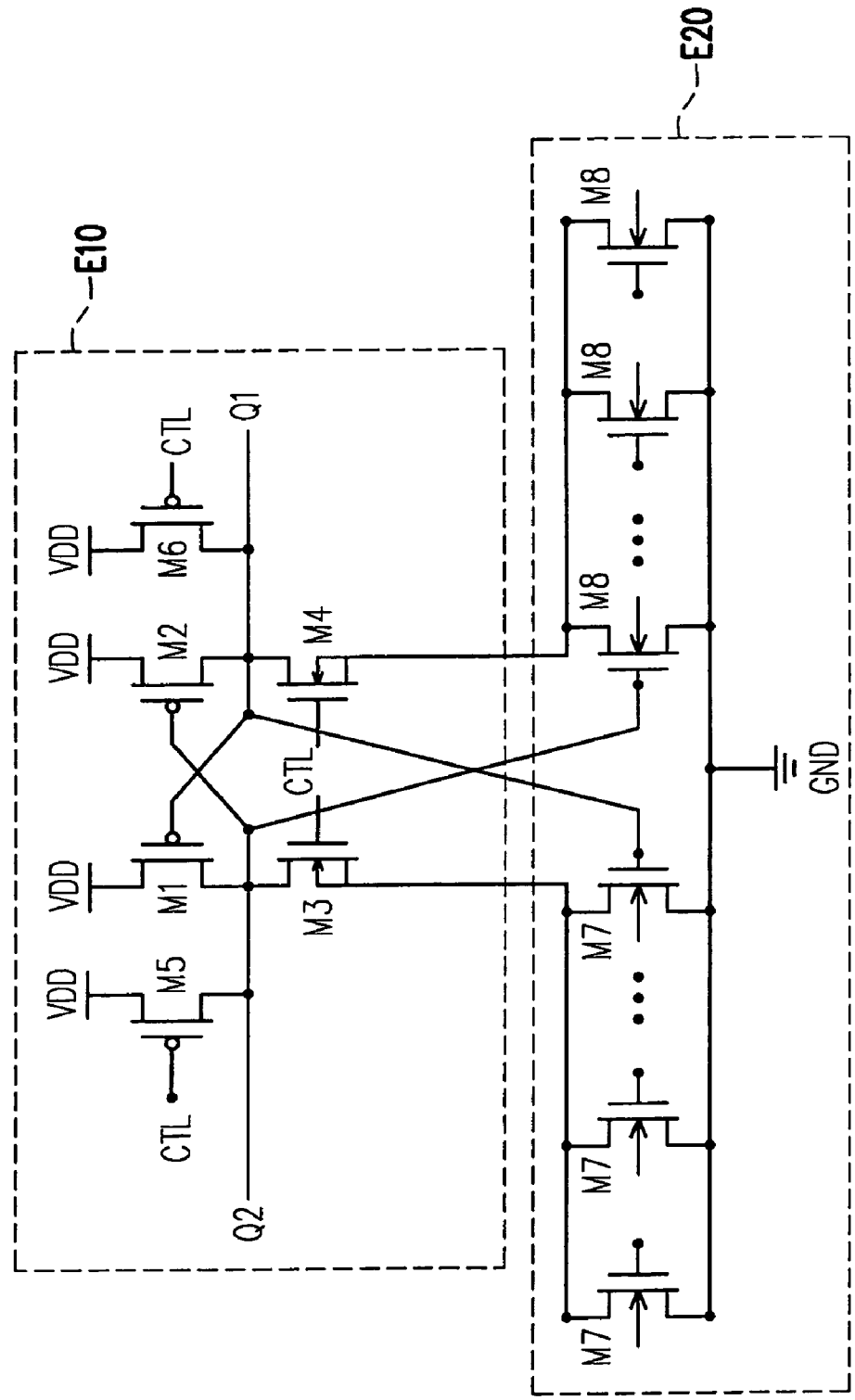
FIGS. 5A~5E are circuit diagrams respectively illustrating an N-type bulk input current switch logic circuit according to different embodiments of the present invention.
Figure 5B:
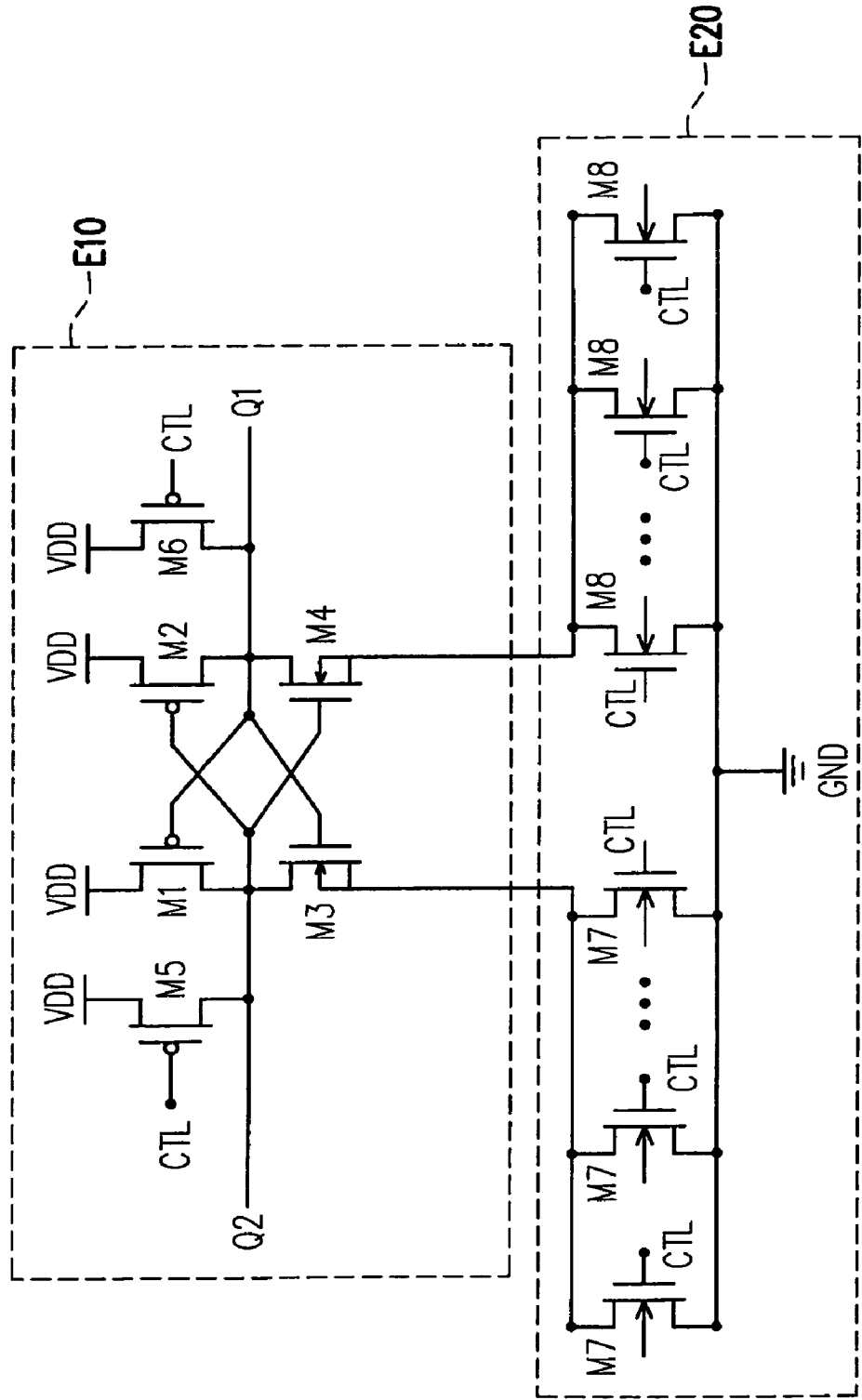
Figure 5C:
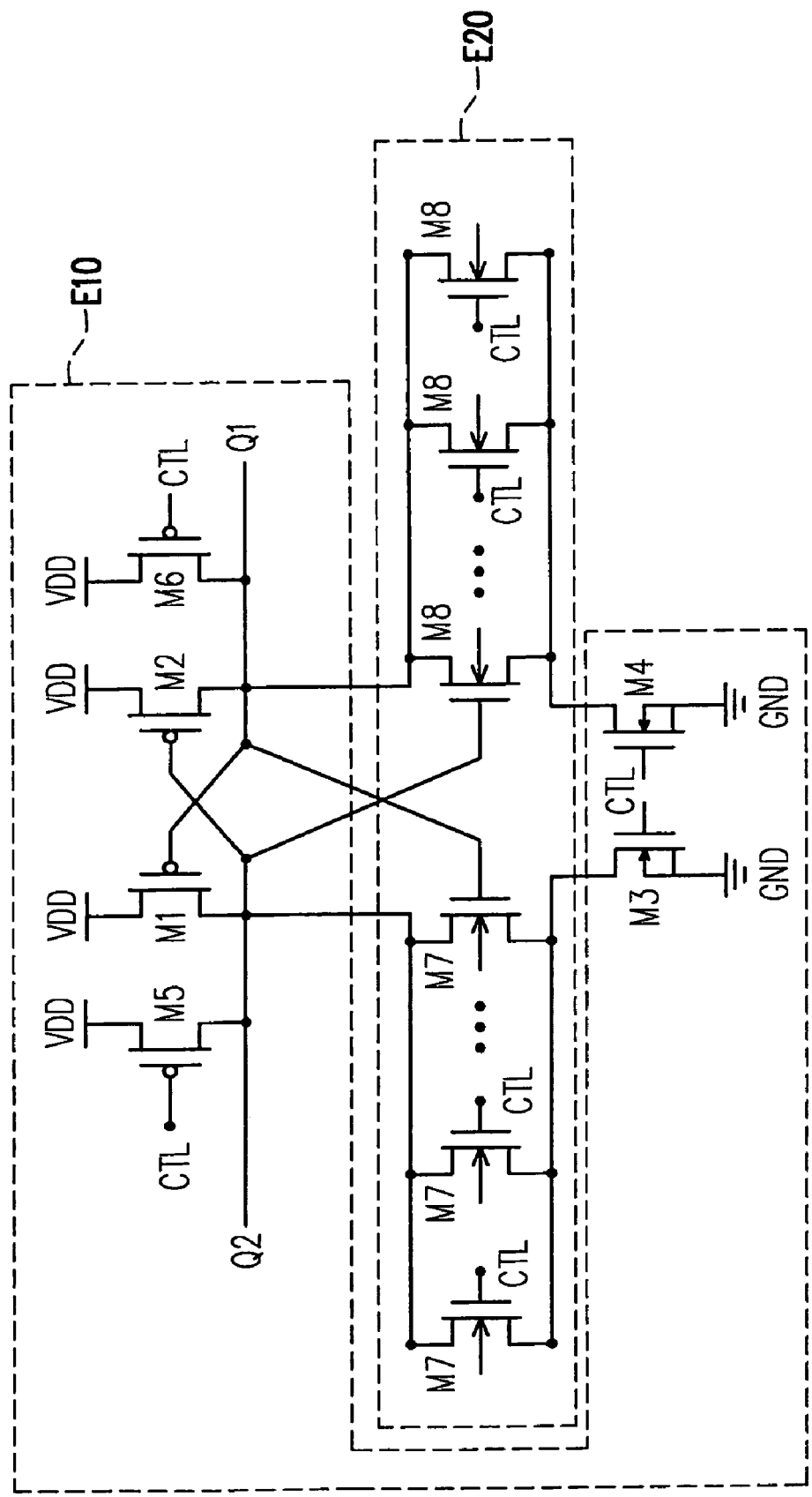
Figure 5D:
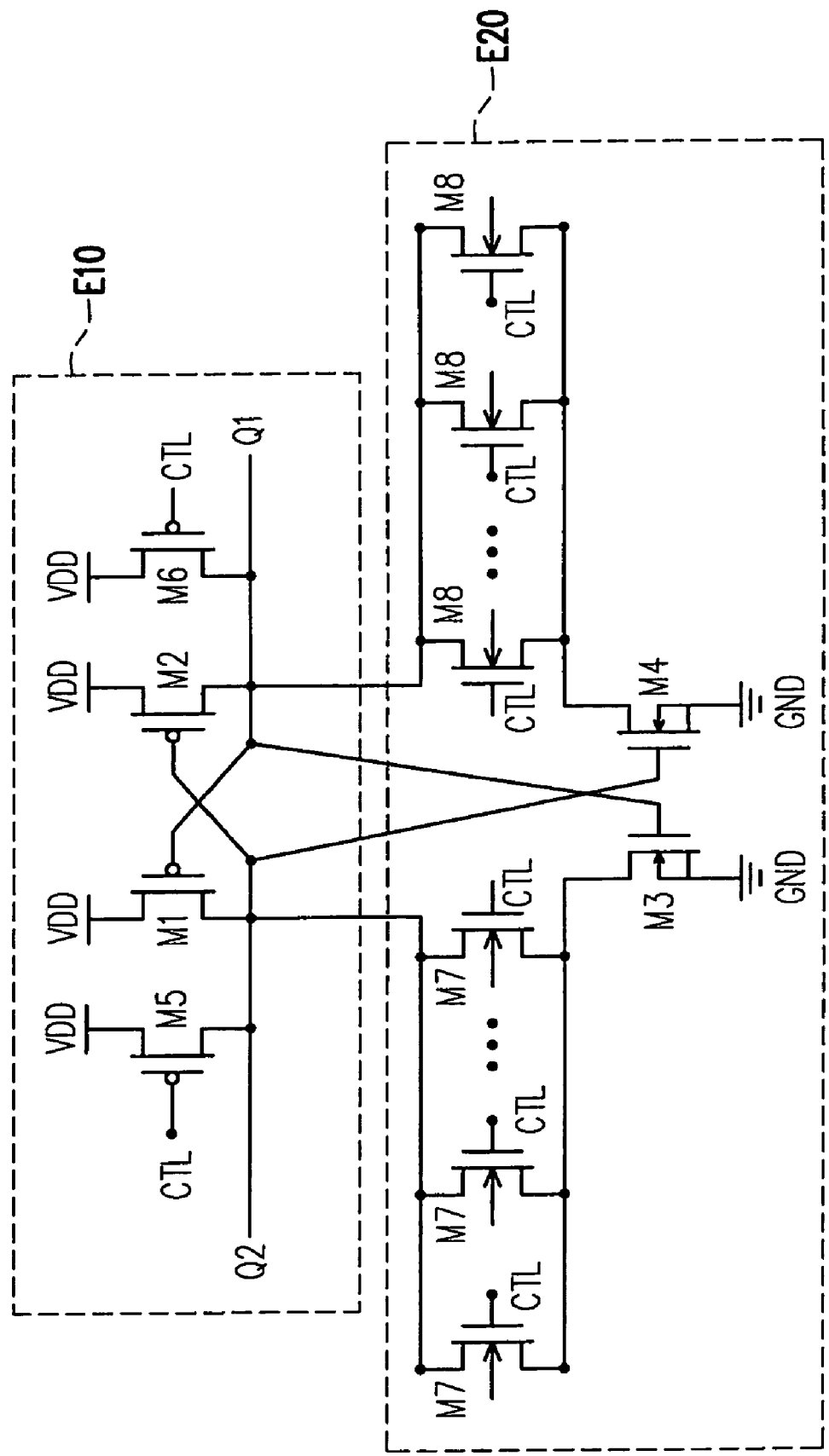

The present invention provides a bulk input current switch logic circuit. Referring to FIG. 5A, FIG. 5A is a circuit diagram illustrating an N-type bulk input current switch logic circuit according to an embodiment of the present invention. In the present embodiment, a pre-charge enable signal CTL is coupled to transistors M3 and M4. Moreover, in a logic tree E20, gates of all transistors M7 are coupled to an output terminal Q1, and gates of all transistors M8 are coupled to an output terminal Q2.

In the present embodiment, operation method of the circuit is described as follows. When the pre-charge enable signal CTL is enabled (which is level "0" in the present embodiment), levels of the output terminals Q1 and Q2 are lowered to a system voltage VDD, i.e. level "1" due to turning on of transistors M5 and M6. Next, the pre-charge enable signal CTL is transited to be disabled (which is level "1" in the present embodiment). Now, the transistors M5 and M6 are turned off, and the transistors M3 and M4 are turned on. On the other hand, a gate of the transistor M7 receives an input signal IN1, and a base thereof receives an input signal IN2. Since the transistor M7 is an N-type metal-oxide-semiconductor (MOS), the input signal IN2 has to be less than or equal to the input signal IN1, otherwise a leakage channel may be generated. Moreover, the transistor M7 may provide a current channel and a current I1 may be generated due to a voltage difference of the input signals IN1 and IN2. Correspondingly, a gate of a transistor M8 receives an input signal IN3, and a base thereof receives an input signal IN4. Since the transistor M8 is the N-type MOS, the input signal IN4 has to be less than or equal to the input signal IN3, otherwise the leakage channel may be generated. Moreover, the transistor M8 may provide the current channel and a current I2 may be generated due to a voltage difference of the input signals IN3 and IN4.

In addition, a current sense amplifier E10 is used for comparing the current I1 and the current I2. If the current I1 is greater than the current I2, the output terminal Q2 outputs the level "0", and the output terminal Q1 outputs the level "1". Conversely, if the current I2 is greater than the current I1, the output terminal Q2 outputs the level "1", and the output terminal Q1 outputs the level "0".

There may be a plurality of variations of the aforementioned bulk input current switch logic circuit. FIGS. 5B~5E illustrate circuit diagrams of an N-type bulk input current switch logic circuit according to different embodiments of the present invention. Wherein, these different embodiments denotes that a correlation of the logic tree E20 and the current sense amplifier E10 may be varied, and the transistor M8 may substitute the transistor M4 (similarly, the transistor M7 may also substitute the transistor M3) for changing a coupling position of the gate thereof. However, all of the embodiments have the same operation principle and the same design, and detailed description thereof will not be repeated.

Figure 5E:
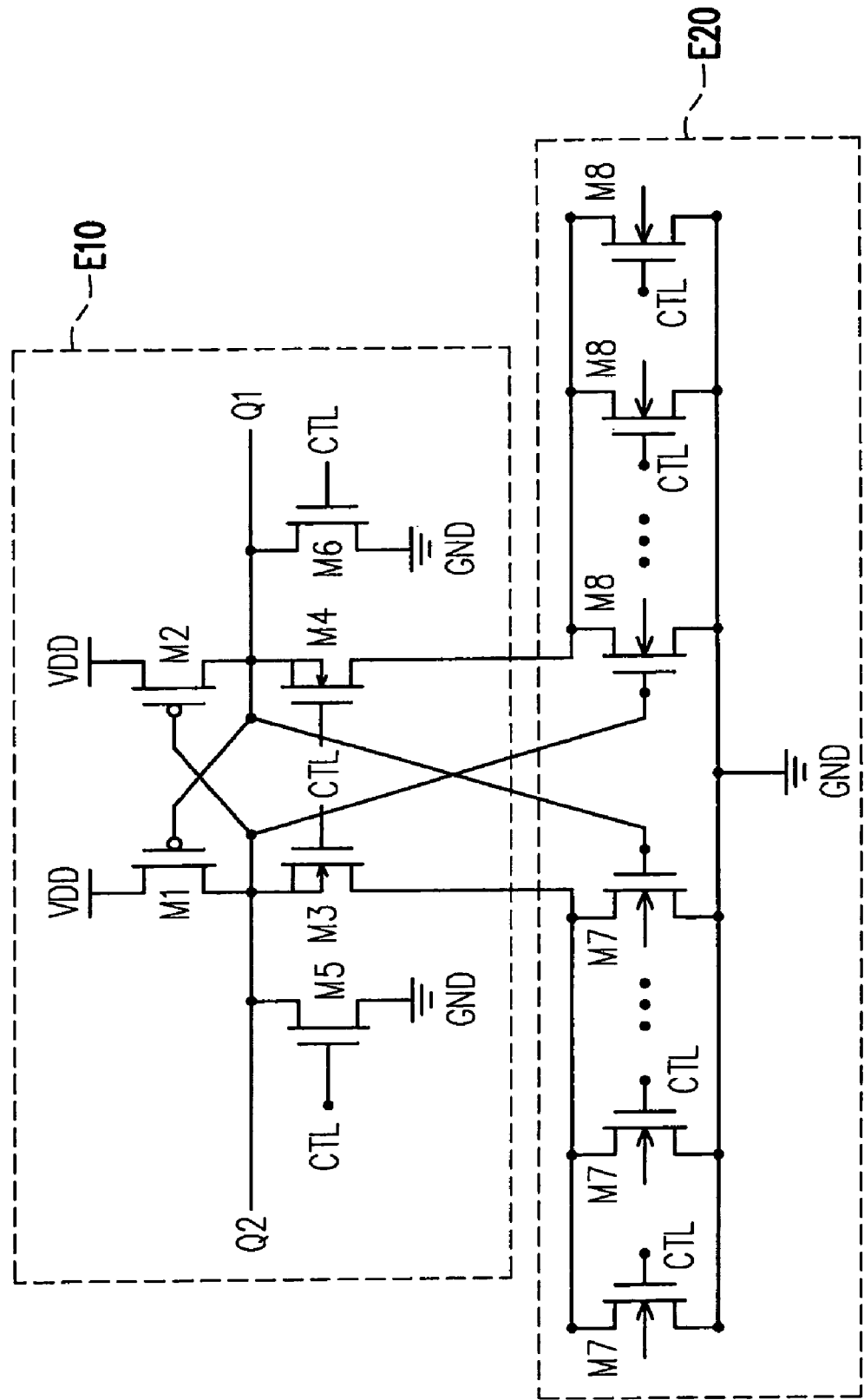
Figure 6A:
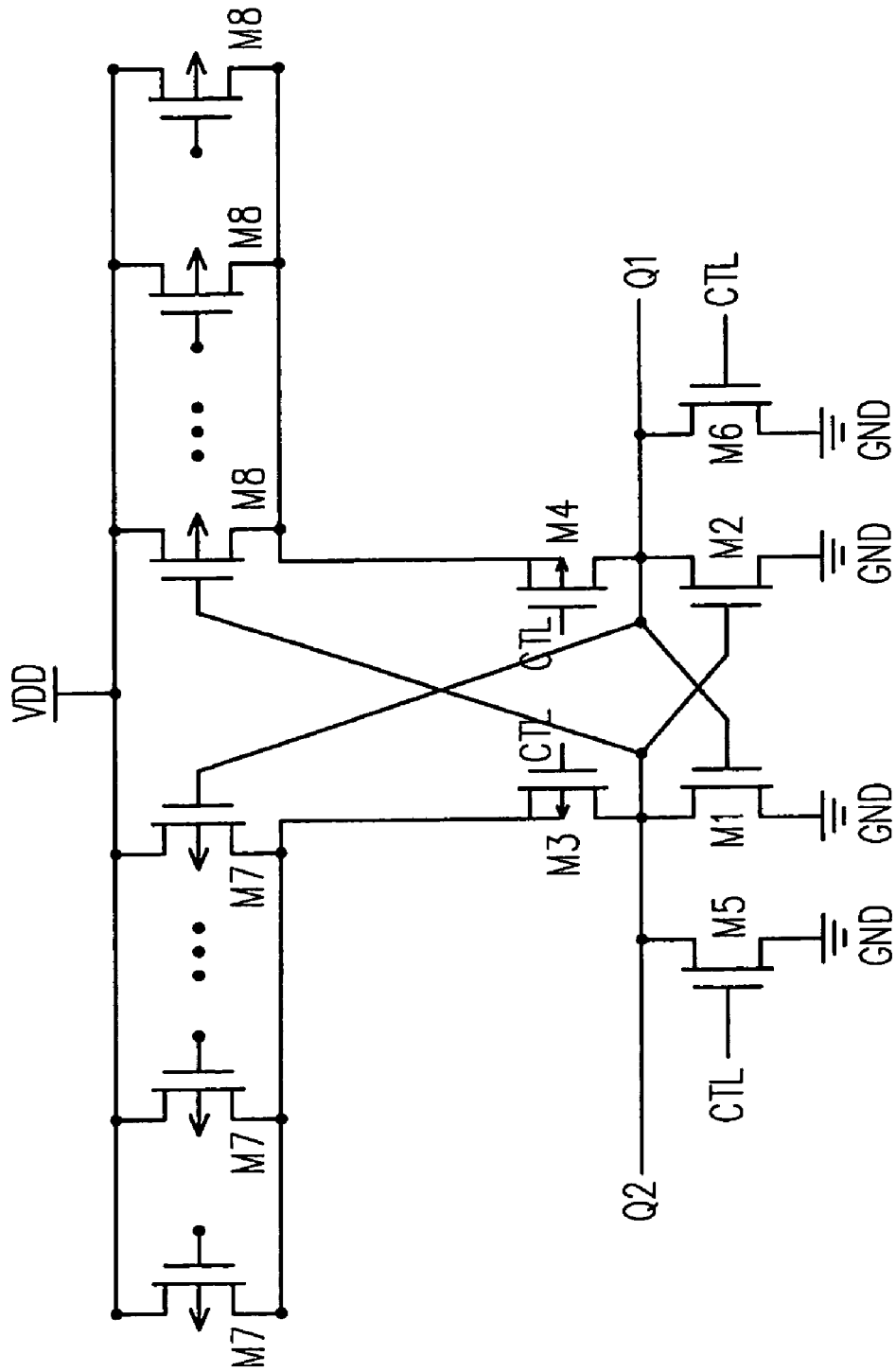
FIGS. 6A~6E are circuit diagrams respectively illustrating a P-type bulk input current switch logic circuit according to different embodiments of the present invention.
Figure 6B:
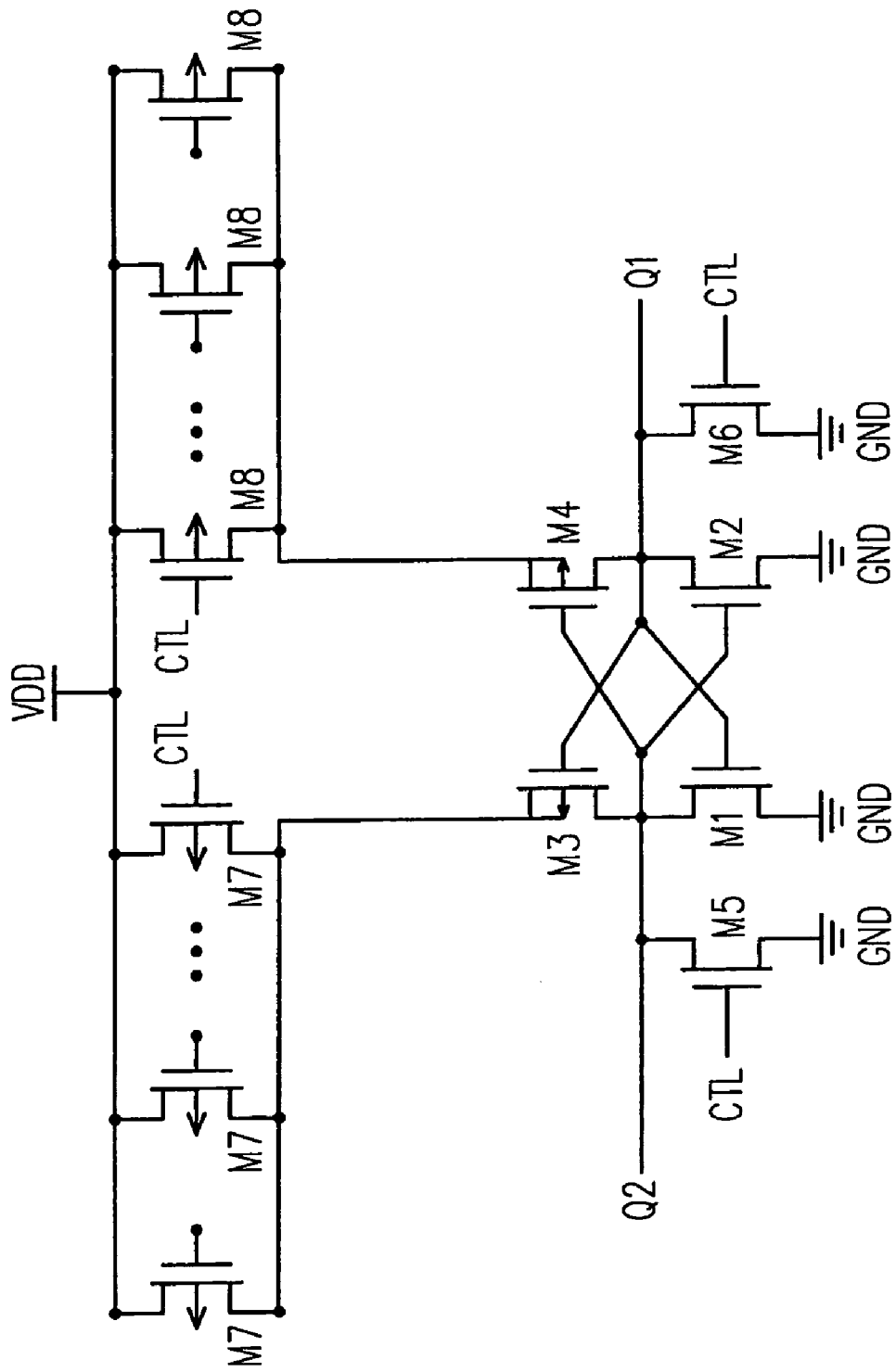
Figure 6C:
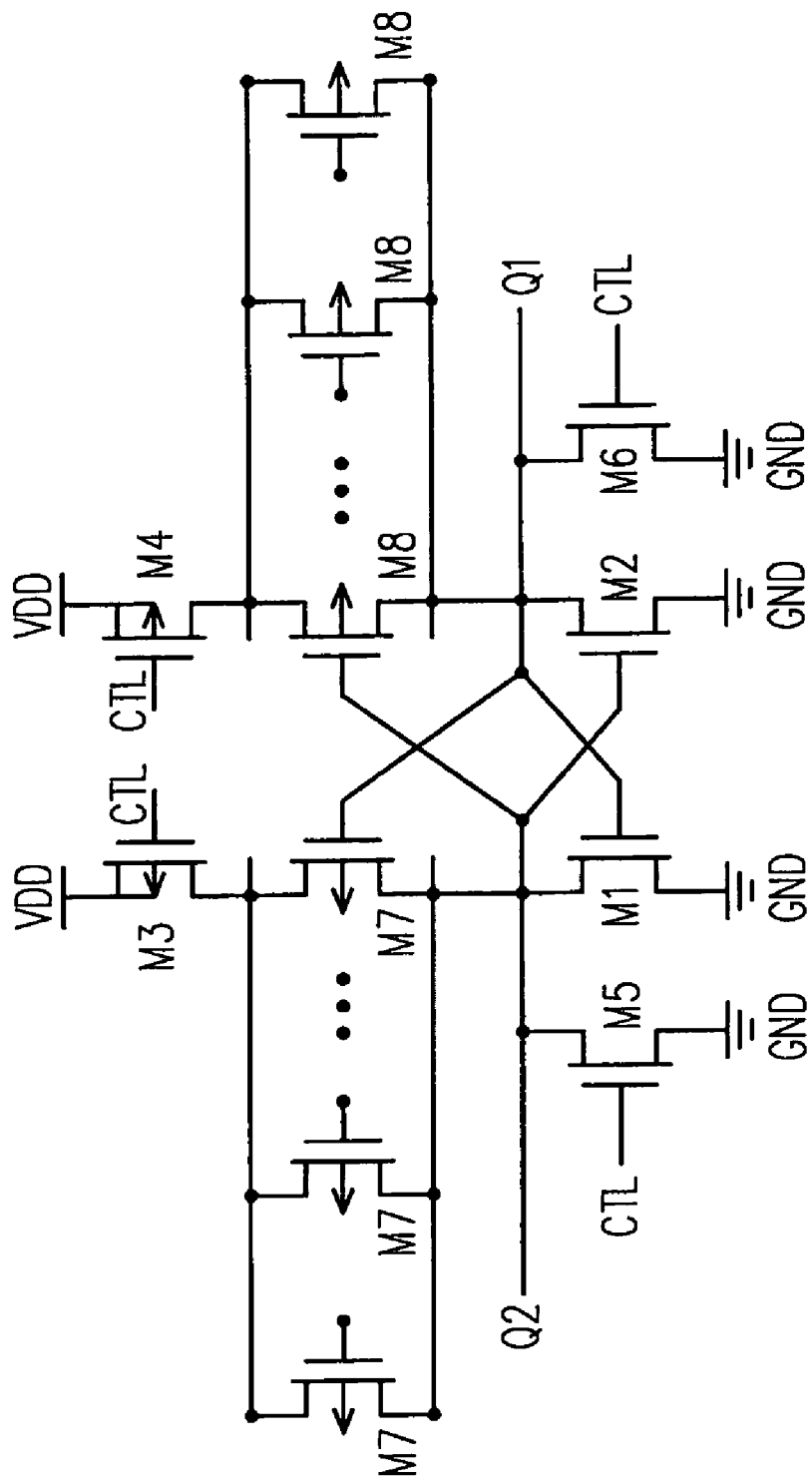
Figure 6D:
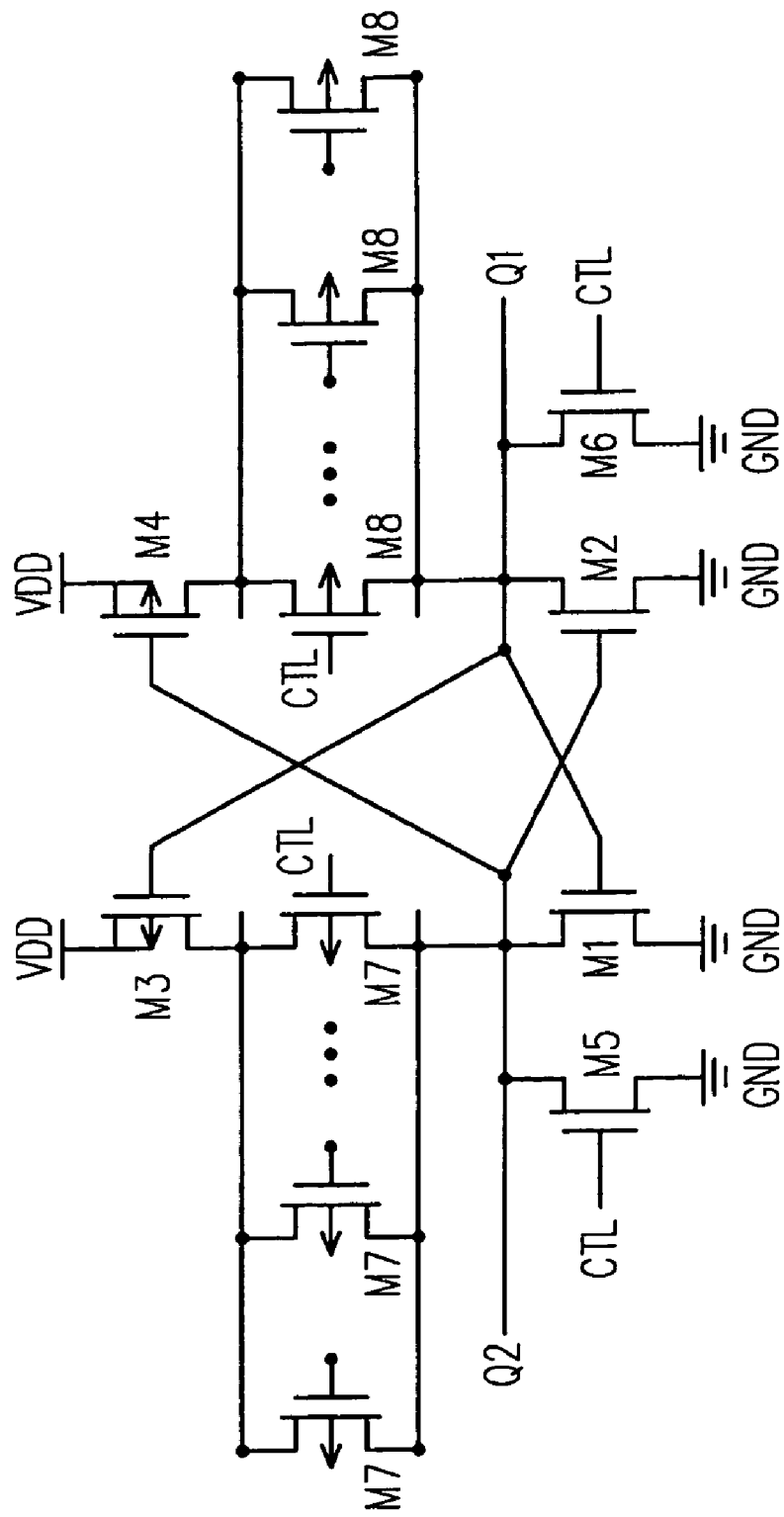
Figure 6E:
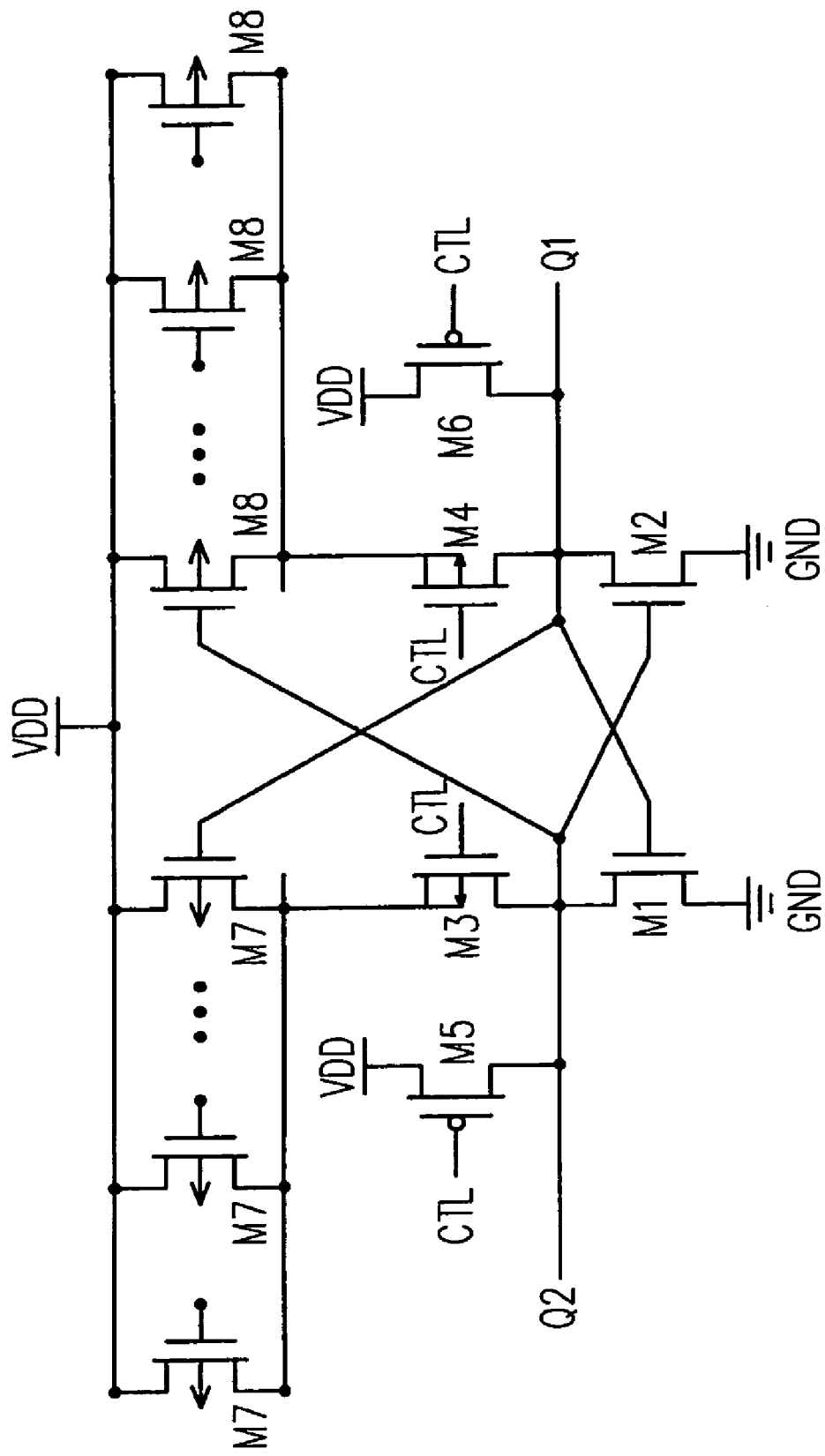

Moreover, it should be noted that the transistors M5 and M6 providing the pre-charge function is not limited to pre-charge the current sense amplifier E10 to the system voltage VDD, but may also pre-charge the current sense amplifier E10 to a ground voltage GND as shown in FIG. 5E.

FIGS. 6A~6E illustrate circuit diagrams of a P-type bulk input current switch logic circuit according to different embodiments of the present invention. These embodiments are P-type embodiments respectively corresponding to the embodiments of FIGS. 5A~5E. Wherein, transistors M1 and M2 are changed to the N-type transistors, and second sources/drains thereof are coupled to the ground voltage GND, while transistors M3, M4, M7 and M8 are changed to the P-type transistors. Moreover, the transistors M5 and M6 used for providing the pre-charge function are also not limited to pre-charge the current sense amplifier E10 to the ground voltage GND, but may also pre-charge the current sense amplifier E10 to the system voltage VDD.

It should be noted that regardless of the P-type or the N-type bulk input current switch logic circuit, there is a difference between the input signals IN1 and IN2, or between the input signals IN3 and IN4. In a general logic circuit, a logic of the input voltage generally considers the system voltage VDD to be the level "1", and considers the ground voltage GND to be the level "0". Therefore, an boost circuit has to be included for generating a voltage higher than the system voltage VDD or a voltage lower than the ground voltage GND. To fully convey the spirit of the present invention, different types of the boost circuit are described in the following content.

Figure 7:
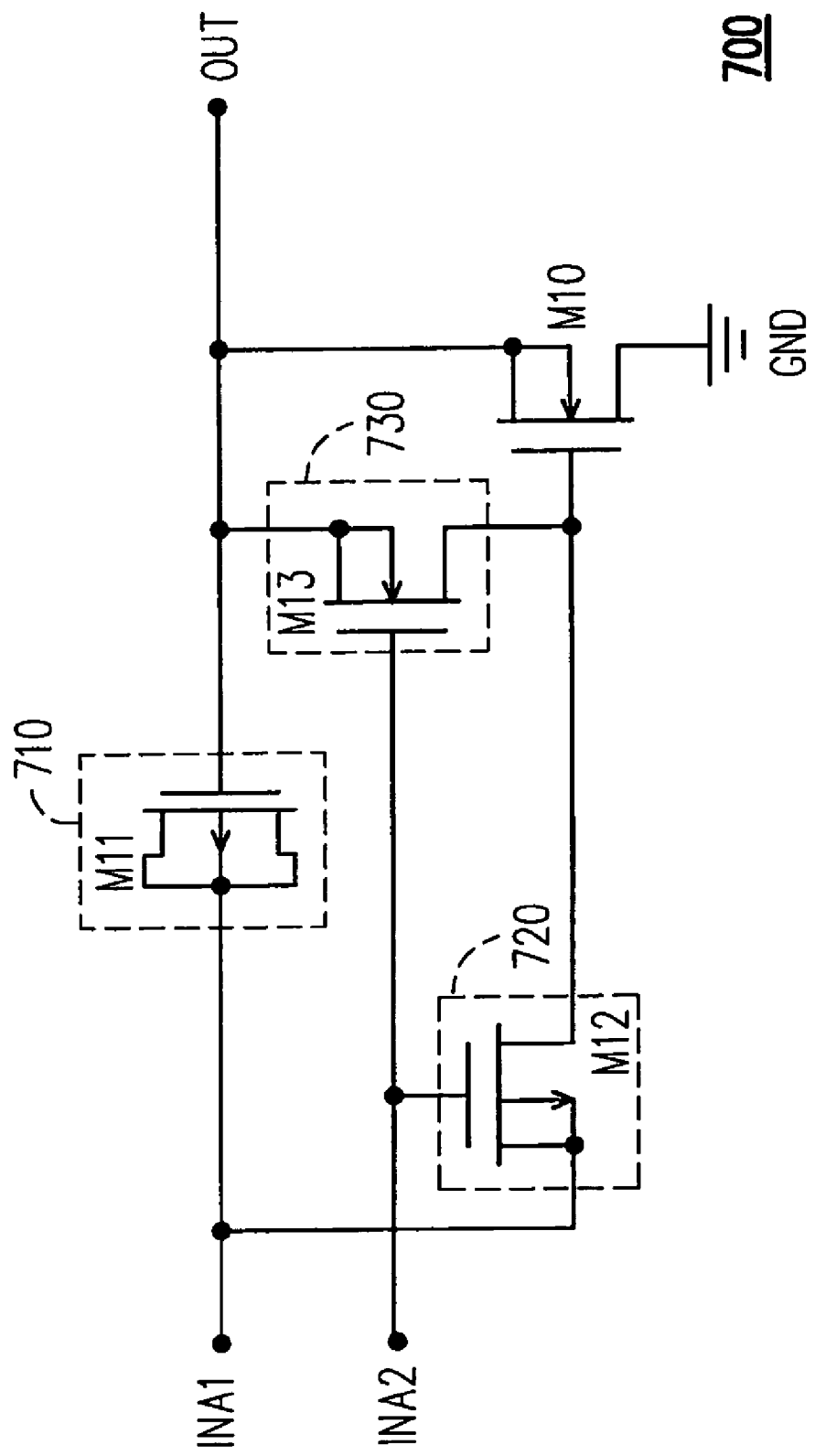
FIG. 7 and FIG. 8 are circuit diagrams respectively illustrating an boost circuit according to an embodiment of the present invention.

FIG. 7 is a circuit diagram illustrating an boost circuit according to an embodiment of the present invention. The boost circuit 700 of the present embodiment is an N-type boost circuit including a capacitor 710, switches 720 and 730 and a transistor M10. Wherein, a first terminal of the capacitor 710 is coupled to a first input terminal INA1 of the boost circuit 700. An input terminal of the switch 720 is coupled to the first input terminal INA1 of the boost circuit 700, and an enable terminal thereof is coupled to a second input terminal INA2 of the boost circuit 700. An input terminal of the switch 730 is coupled to a second terminal of the capacitor 710, an enable terminal thereof is coupled to the second input terminal INA2 of the boost circuit 700, and an output terminal thereof is coupled to an output terminal of the switch 720. Moreover, a gate of the transistor M10 is coupled to the output terminal of the switch 730, a first source/drain thereof and the second terminal of the capacitor 710 are coupled to an output terminal OUT of the boost circuit 700, and a second source/drain thereof is coupled to a third voltage. It should be noted that in the present embodiment, the capacitor 710 is formed by a transistor M11, and the switches 720 and 730 are respectively formed by transistors M12 and M13. Here, the transistors M10 and M13 are the N-type MOSs, the transistors M11 and M12 are the P-type MOSs, and the third voltage is the ground voltage GND.

Moreover, a first source/drain, a second source/drain and a based of the transistor M11 forming the capacitor 710 are coupled to the first/second terminal of the capacitor 710, a gate of the transistor M11 is coupled to the second/first terminal of the capacitor 710. A gate of the transistor M12 forming the switch 720 is coupled to the enable terminal of the switch 720, a first source/drain and a base thereof is coupled to the input terminal of the switch 720, and a second source/drain thereof is coupled to the output terminal of the switch 720. A gate of the transistor M13 forming the switch 730 is coupled to the enable terminal of the switch 730, a first source/drain and a base thereof are coupled to the input terminal of the switch 730, and a second source/drain thereof is coupled to the output terminal of the switch 730.

Figure 8:
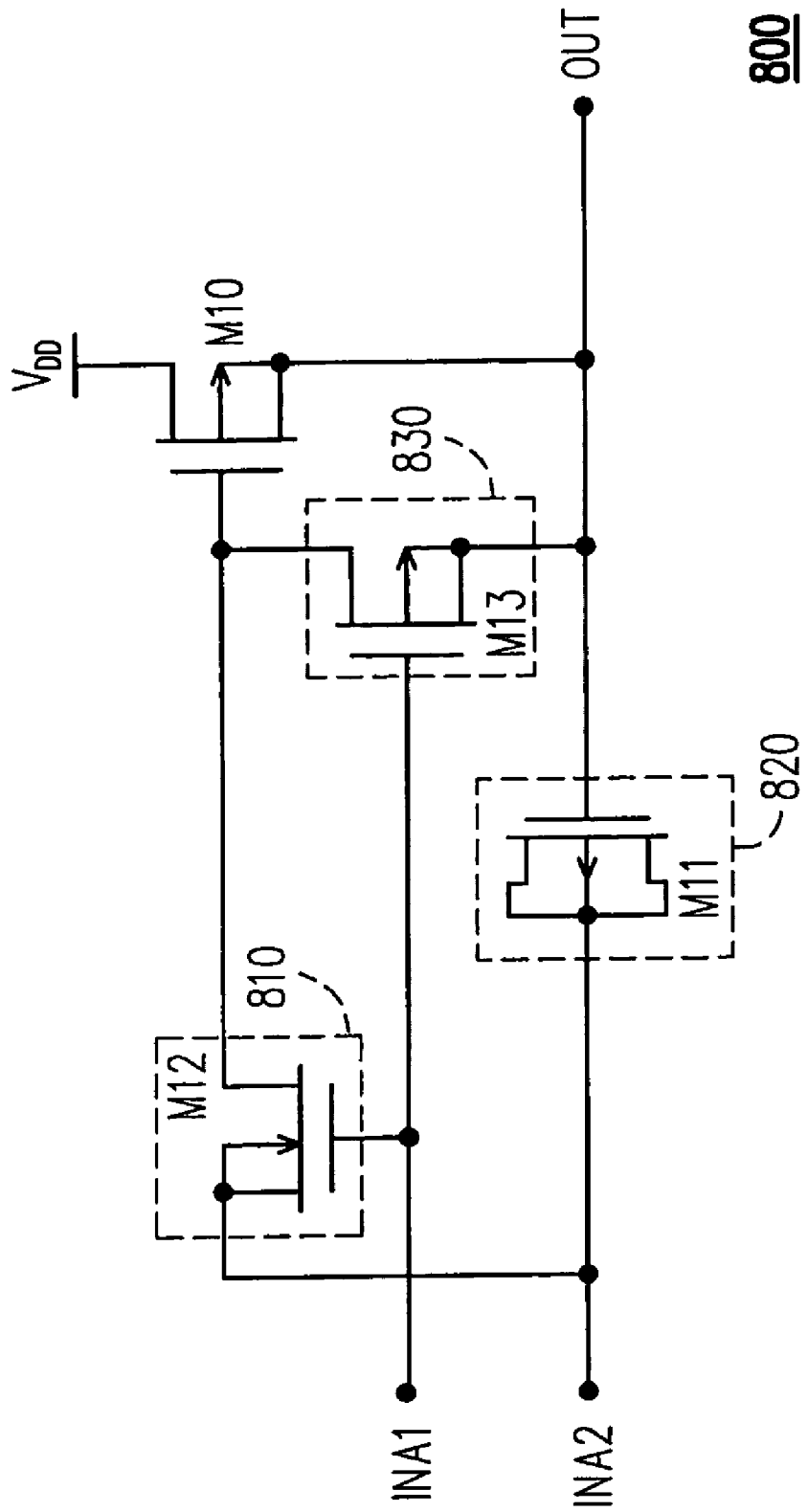

FIG. 8 is a circuit diagram illustrating an boost circuit according to another embodiment of the present invention. The boost circuit 800 of the present embodiment is a P-type boost circuit including a capacitor 810, switches 820 and 830 and a transistor M10. Differences between the boost circuit 800 and the aforementioned boost circuit 700 are that the transistors M10, M11 and M13 are all the P-type MOS, the transistor M12 is the N-type MOS, and the third voltage is coupled to the system voltage VDD. Moreover, it should be noted that regardless of the N-type boost circuit 700 or the P-type boost circuit 800, the capacitors utilized therein includes any type of transistor coupling to be the capacitor, which is not limited to be the N-type MOS shown in figures.

Figure 9B:
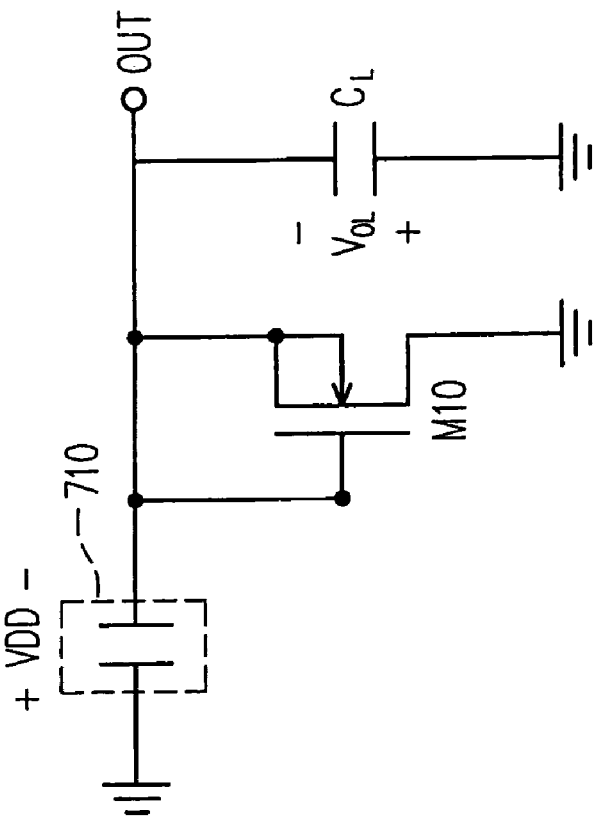
FIG. 9B is a circuit diagram illustrating an equivalent circuit of the N-type boost circuit 700 during another period.
Figure 9A:
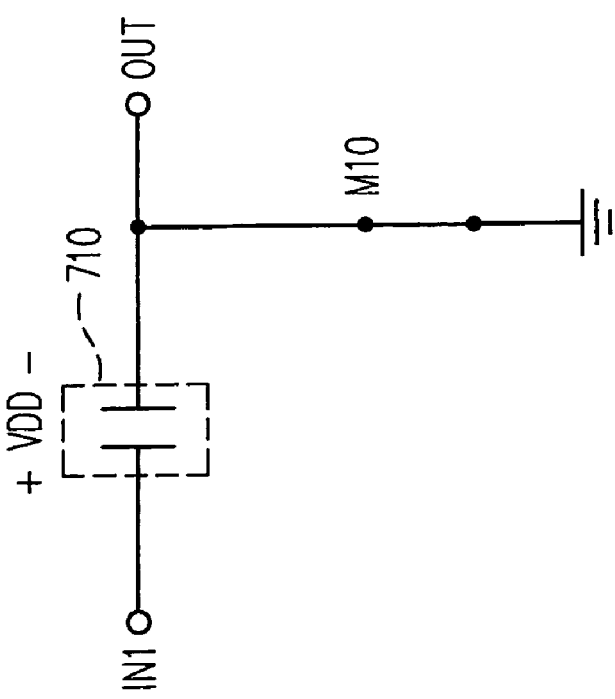
FIG. 9A is a circuit diagram illustrating an equivalent circuit of the N-type boost circuit 700 during a certain period.

As to the operation method of the boost circuit, please refer to FIG. 7 and FIG. 9A. FIG. 9A is a circuit diagram illustrating an equivalent circuit of the N-type boost circuit 700 during a certain period. Wherein, an input terminal IN1 of FIG. 9A is equivalent to the first input terminal INA1 of FIG. 7. In FIG. 7, a voltage of the first input terminal INA1 has the high level "1", and a voltage of the second input terminal INA2 is an inversion with that of the first input terminal INA1, which has the low level "0". Therefore, the switch 720 is enabled and the switch 730 is disabled. A gate of the transistor M10 is now electrically connected to the high level, and therefore the transistor M10 may be considered to be a turned on switch. The first terminal of the capacitor 710 is electrically connected to the input terminal INA1 (i.e. the high level), and the second terminal of the capacitor 710 is equivalent to being electrically connected to the ground voltage GND, and therefore the capacitor 710 is charged. In the general logic circuit, the high level is equivalent to the system voltage VDD, namely, the first terminal of the capacitor 710 is charged to the system voltage VDD, and the output terminal OUT is electrically connected to the ground voltage GND.

Referring to FIG. 9B, FIG. 9B is a circuit diagram illustrating an equivalent circuit of the N-type boost circuit 700 during another period. Now, the voltage of the first input terminal INA1 is transited to be the low level "0", and the voltage of the second input terminal INA2 is transited to be the high level "1". Now, the switch 720 is disabled, and the switch 730 is enabled. Since the voltage of the first input terminal INA1 is transited to be the low level "0", in the logic circuit, the low level "0" generally represents the ground voltage GND, i.e. 0V. Therefore, the first terminal of the capacitor 710 is momentarily coupled to the 0V, so that the second terminal of the capacitor 710 is boosted to the −VDD. The transistor M10 functions as a diode since a gate thereof is changed to electrically connect to the second terminal of the capacitor 710. Meanwhile, a parasitic capacitor CL of the output terminal OUT of the boost circuit 700 is inversely charged, so that the voltage of the output terminal OUT is $-V_{OL}$. Wherein, an absolute value of the voltage $-V_{OL}$ of the output terminal OUT is slightly less than the system voltage VDD.

Figure 9C:
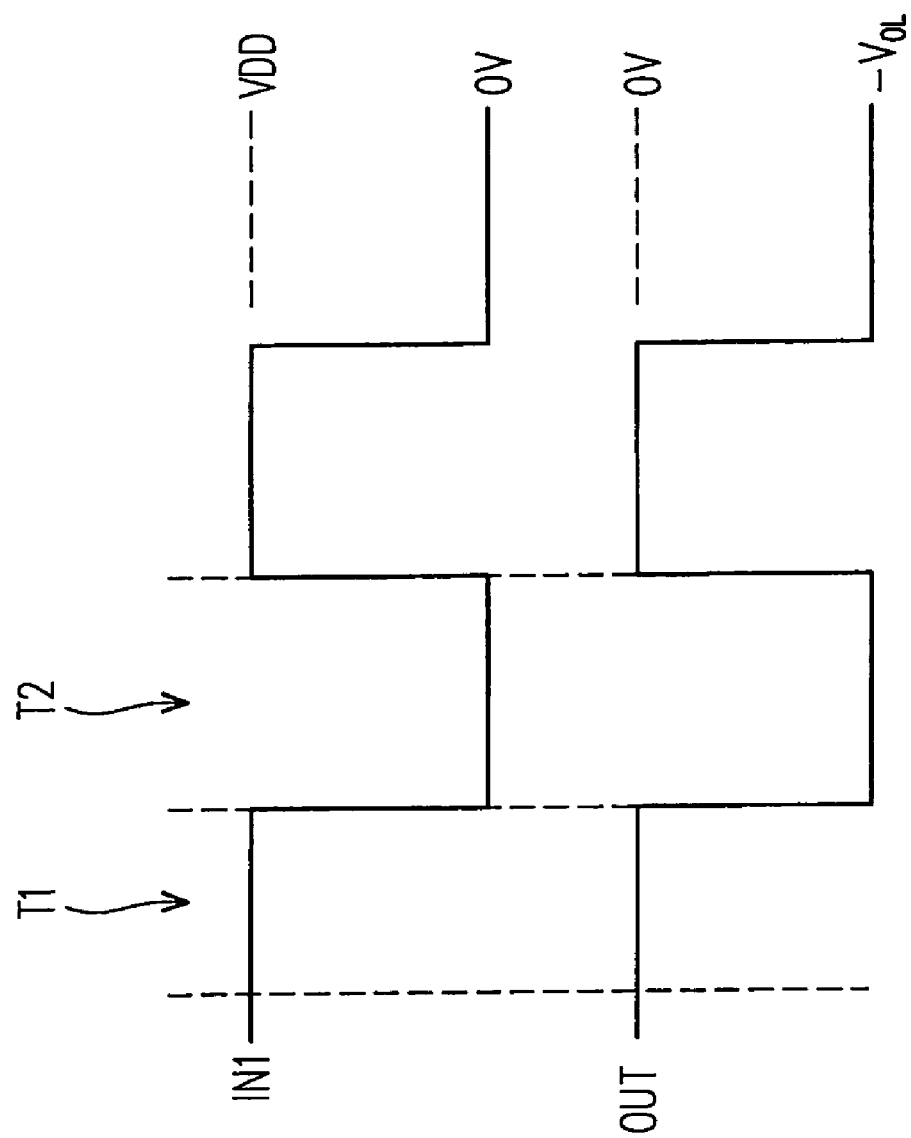
FIG. 9C is a diagram illustrating a relation between an output voltage and an input voltage of the N-type boost circuit 700.

FIG. 9C is a diagram illustrating a relation between an output voltage and an input voltage of the N-type boost circuit 700. During a period T1, the first input terminal IN1 has the system voltage VDD, and according to the above description, the output terminal OUT has the ground voltage GND (=0V). During a period T2, since the voltage of the first input terminal IN1 is transited to the ground voltage GND, the voltage of the output terminal is then boosted to $-V_{OL}$.

In the present embodiment, only the N-type boost circuit 700 is described, however, operation of the P-type boost circuit 800 is similar to that of the N-type boost circuit 700. A difference there between is that the generated voltage of the output terminal OUT is between the system voltage VDD and $V_{OH}$, wherein $V_{OH}$ is slightly less than twice of the system voltage VDD.

Figure 10A:
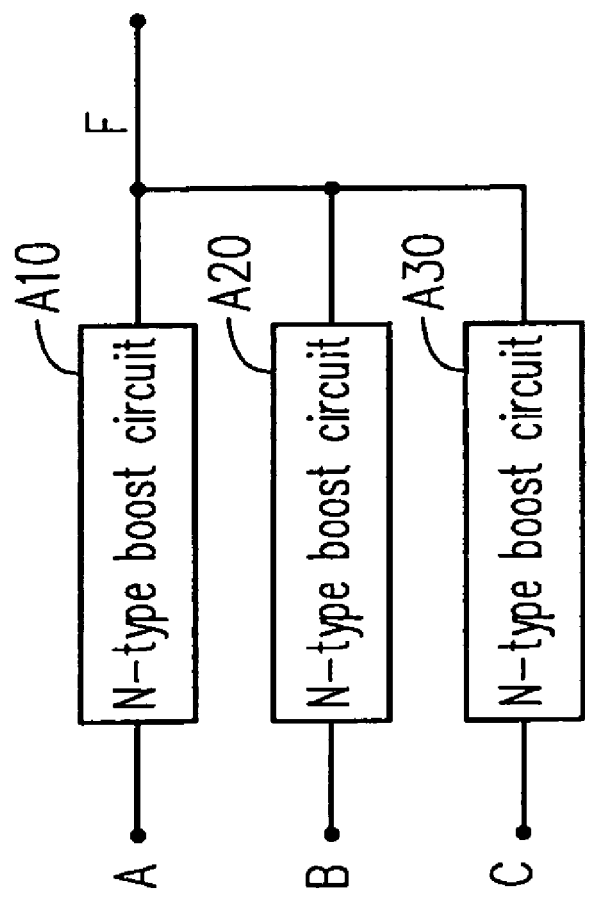
FIG. 10A is an embodiment of an OR gate circuit formed by N-type boost circuits.
Figure 10B:
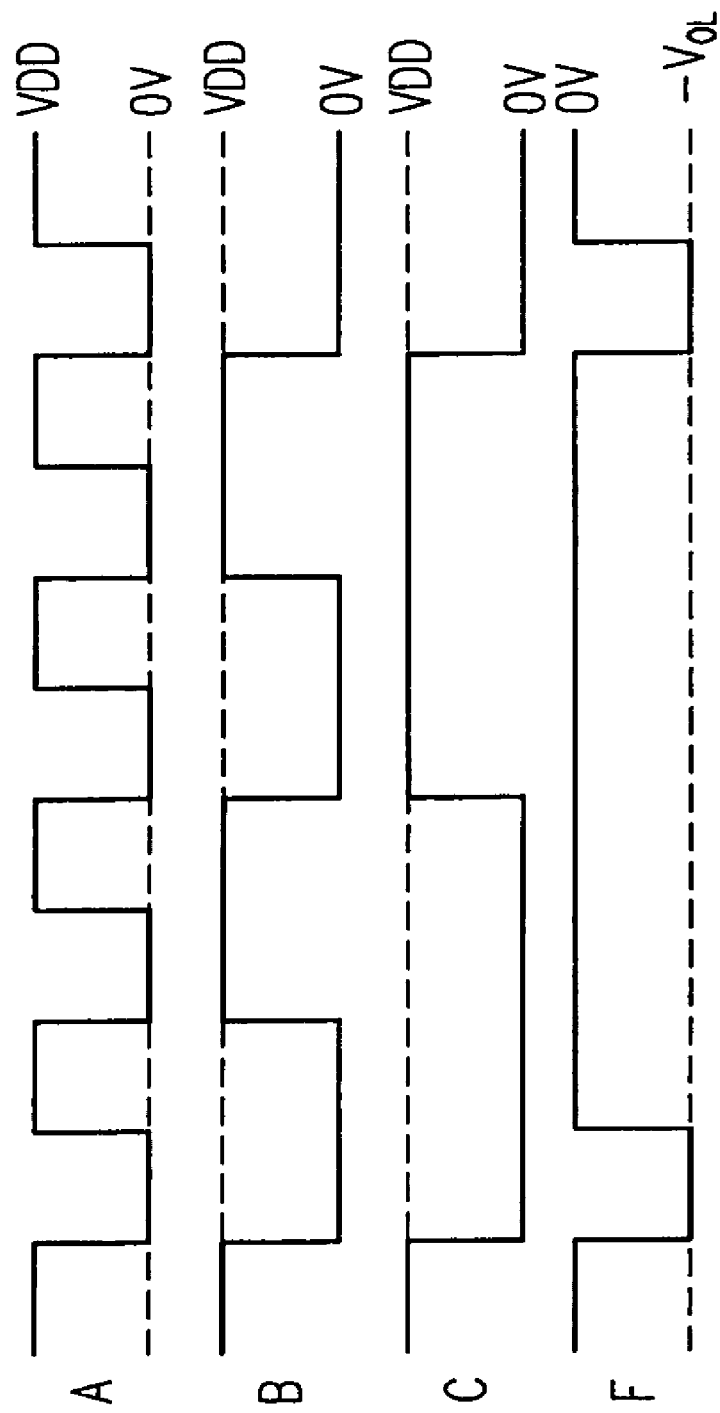
FIG. 10B is a diagram illustrating an input and output waveforms of an OR gate circuit formed by N-type boost circuits.

Moreover, a plurality of the N-type boost circuits may further form an OR gate or an NAND gate logic circuit. FIG. 10A is an embodiment of an OR gate circuit formed by N-type boost circuits. Such OR gate circuit may be simply implemented by connecting the output terminals of a plurality of the N-type boost circuits to form a wire OR gate. Meanwhile, a problem of voltages confliction is avoided. In the present embodiment, three N-type boost circuits A10~A30 are applied for respectively receiving an input A, an input B, and an input C. Referring to FIG. 10B, FIG. 10B is a diagram illustrating an input and output waveforms of an AND gate circuit formed by N-type boost circuits.

When the inputs A, B and C are all level "0", since the three boost circuits are all inversely charged, an output F has the level $-V_{OL}$. If at least one of the inputs A, B and C has the level "1", for example, if the input A has the level "1", the output terminal of the boost circuit A10 is then pulled to the ground voltage, which is referred to as strong pull low. Such strong pull low makes the output terminals of the boost circuits A20 and A30 to be together pulled to the ground voltage GND. Therefore, the voltage of the output F is then the ground voltage GND. In the output F, since the ground voltage GND is the relatively high level, it may be considered to be the level "1", and the $-V_{OL}$ then may be considered to be the low level "0". Moreover, if the inputs A, B and C are all inverted and input to the OR gate formed by the N-type boost circuits, a logic effect of an NAND then may be achieved.

Figure 11A:
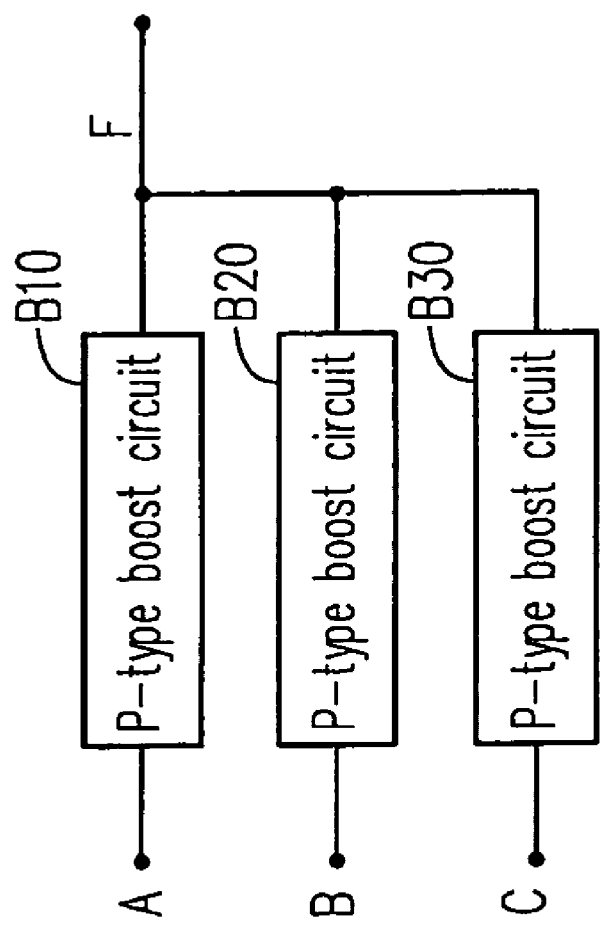
FIG. 11A is an embodiment of an AND gate circuit formed by P-type boost circuits.
Figure 11B:
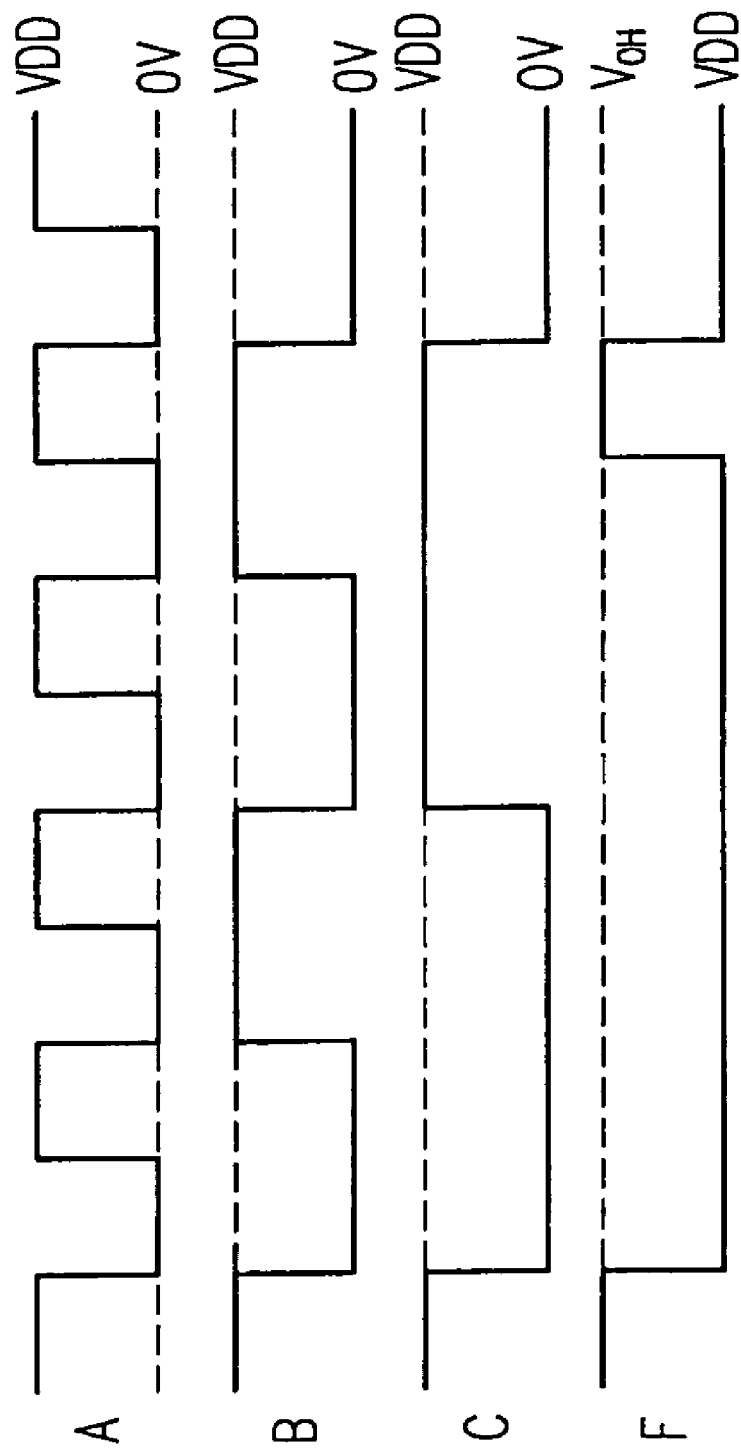
FIG. 11B is a diagram illustrating an input and output waveforms of an AND gate circuit formed by P-type boost circuits.

According to a same principle as above, an AND gate or an NOR gate logic circuit then may be easily obtained via the P-type boost circuits. FIG. 11A is an embodiment of an AND gate circuit formed by P-type boost circuits. Such AND gate circuit may be simply implemented by connecting the output terminals of a plurality of the P-type boost circuits to form a wire AND gate. In the present embodiment, three P-type boost circuits B10~B30 are applied. FIG. 11B is a diagram illustrating an input and output waveforms of an AND gate circuit formed by P-type boost circuits. An operation method thereof is similar to that of the OR gate circuit formed by the N-type boost circuits, and therefore the detailed description thereof will not be repeated.

Here, an OR gate designed based on the N-type bulk input current switch logic circuit is further provided for those skilled in the art to understand a difference between a simplified bulk input current switch logic circuit and the aforementioned bulk input current switch logic circuit.

Figure 12A:
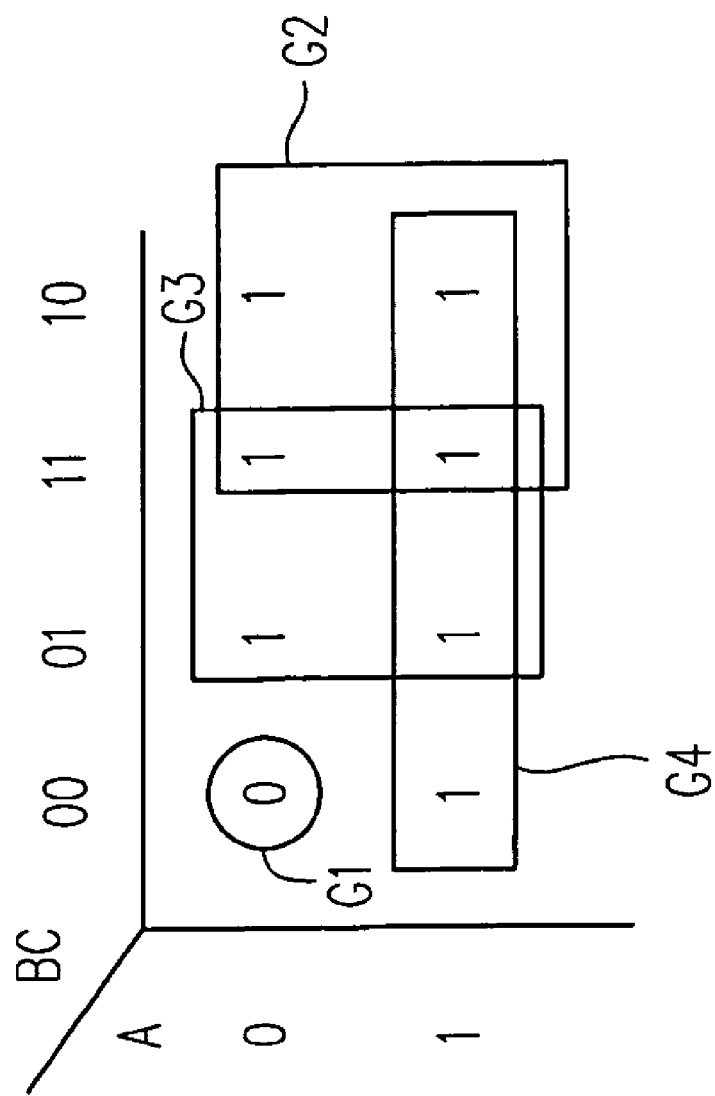
FIG. 12A is a Karnaugh diagram of an OR gate.
Figure 12B:
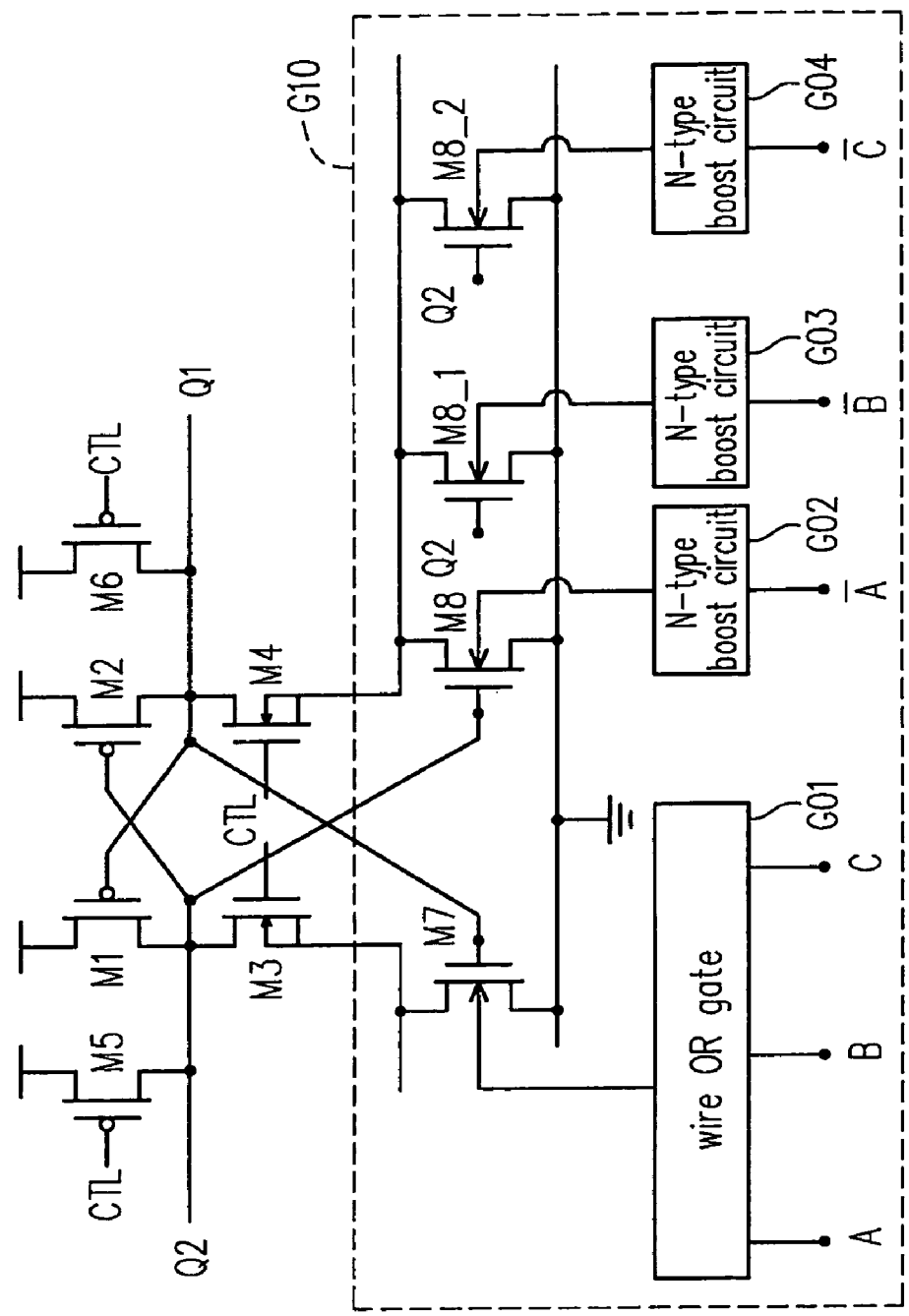
FIG. 12B is a circuit diagram illustrating an OR gate of an N-type bulk input current switch logic circuit.

Referring to FIG. 12A, FIG. 12A is a Karnaugh diagram of an OR gate. The OR gate has input signals A, B and C. Selecting "1" circles and a "0" circle to obtain "1" circles G2~G4 and a "0" circle G1. Wherein the "0" circle G1 represents a logic $\overline{A} \cdot \overline{B} \cdot \overline{C}$ for implementing a right-side circuit of a logic tree G10. The "1" circles G2~G4 represents a logic A+B+C for implementing a left-side circuit of the logic tree G10. FIG. 12B is a circuit diagram illustrating an OR gate of an N-type bulk input current switch logic circuit. Since logic input signals of the present embodiment are all input from bases of transistors, N-type boost circuits G02~G04 are required at the right-side of the logic tree G10 for changing voltage levels of the input signals $\overline{A}$, $\overline{B}$ and $\overline{C}$, and at the left-side of the logic tree G10, the logic A+B+C may be implemented via a wire OR gate G01 formed by three N-type boost circuits.

It should be noted that a basic operation principle of the bulk input current switch logic circuit is to compare currents generated at two sides of the logic tree, in the present embodiment, only one transistor M7 is utilized at the left-side of the logic tree G10, and three transistors M8, M8_1 and M8_2 are utilized at the right-side of the logic tree G10. Therefore, to balance the currents generated at the left-side and the right-side of the logic tree, a channel width/length (W/L) ratio of the transistor M7 has to be tripled compared to that of the transistor M8, and the channel W/L ratios of the M8, M8_1 and M8-2 are equivalent.

Figure 12C:
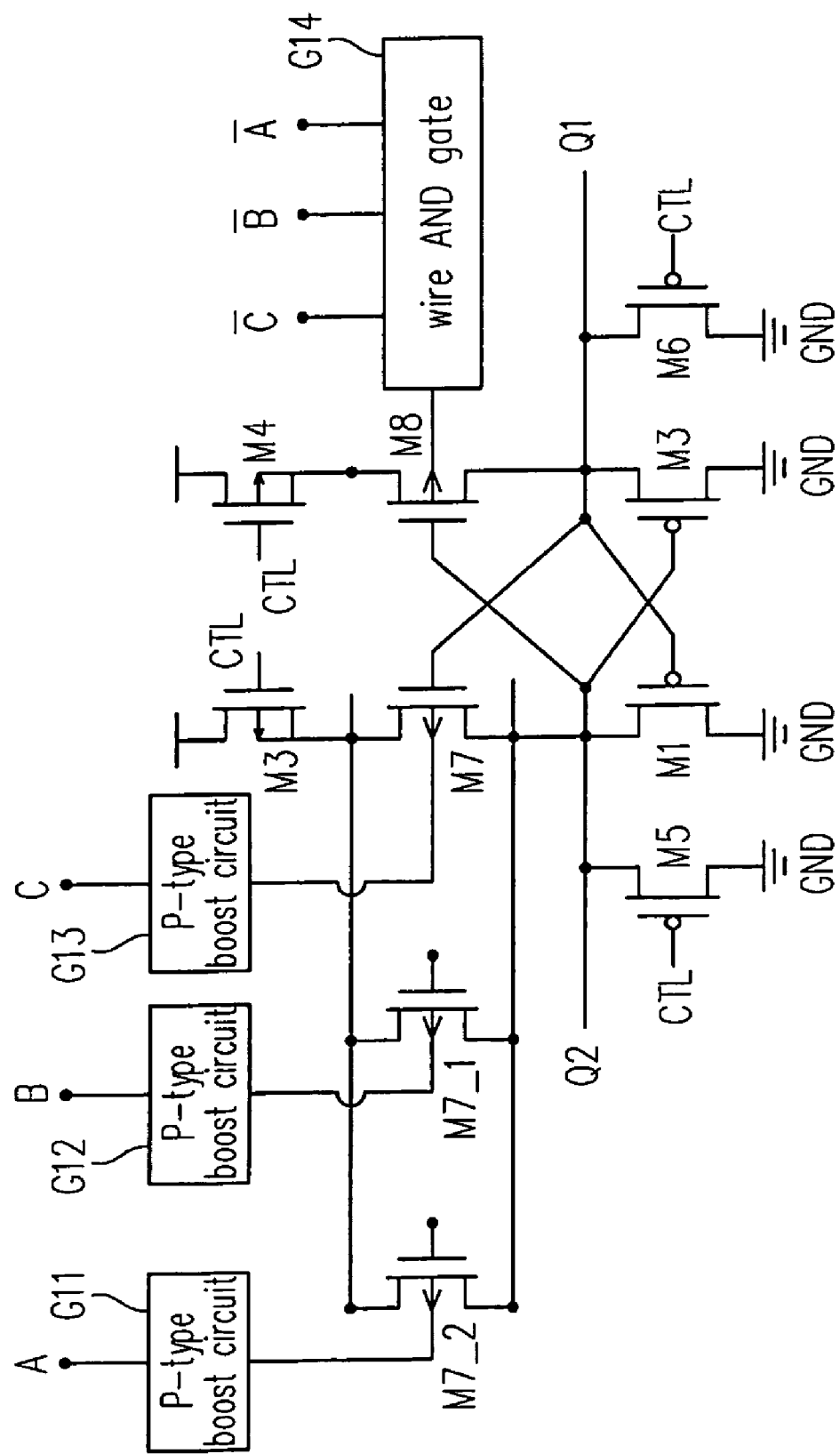
FIG. 12C is a circuit diagram illustrating an OR gate of a P-type bulk input current switch logic circuit.

Similarly, in the aforementioned embodiment, the P-type bulk input current switch logic circuit and the P-type boost circuit may also be applied. FIG. 12C is a circuit diagram illustrating an OR gate of a P-type bulk input current switch logic circuit. A design method thereof is similar to that of the aforementioned N-type bulk input current switch logic circuit, and a difference there between is that the logic $\overline{A} \cdot \overline{B} \cdot \overline{C}$ represented by the "0" circle G1 has to be implemented via a wire AND gate G14, and the logic A+B+C represented by the "1" circles G2~G4 has to be implemented via the P-type boost circuits G11~G13.

Moreover, as to the OR gate function implemented in the present embodiment, since the output terminal Q1 and the output terminal Q2 outputting the inverted signals are simultaneously applied, such OR gate may also be an NOR gate.

Figure 13:
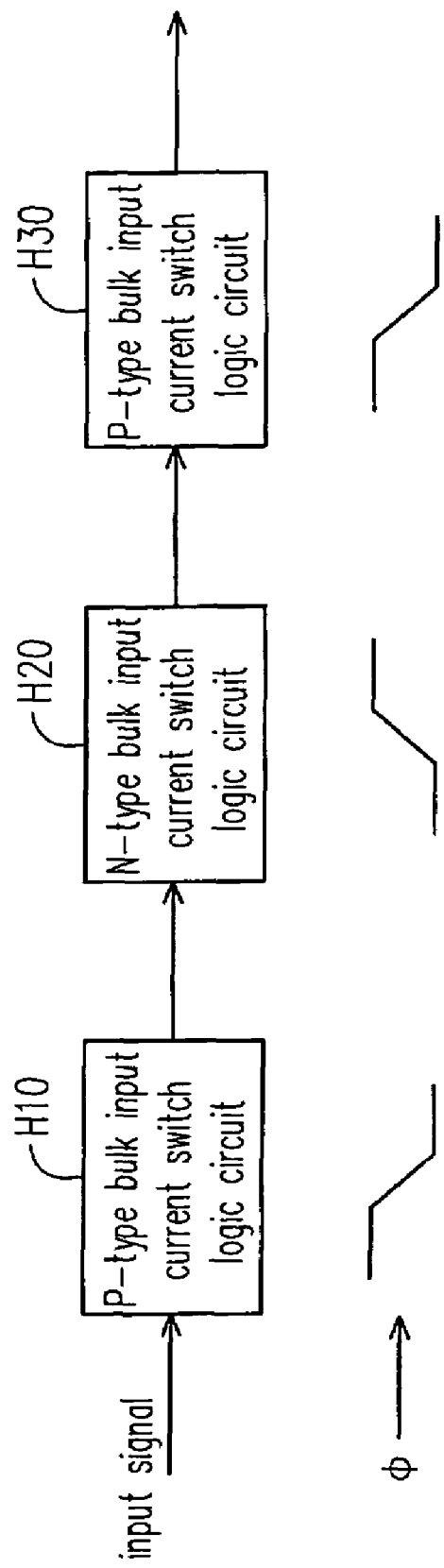
FIG. 13 is a schematic diagram of a pipeline structure according to an embodiment of the present invention.

In addition, hereinafter an application of a pipeline structure may be described with reference to FIG. 13. FIG. 13 is a schematic diagram of a pipeline structure according to an embodiment of the present invention. Wherein, the pipeline structure of the bulk input current switch logic circuit utilize a single phase clock (SPC) control signal. Such structure avails a design of a high speed pipeline system. Since an inverted clock signal is not applied, a problem of clock skew is avoided, so that a clock frequency is improved, an output capacitance is relatively small, a buffer design is relatively easy, and clock distribution structure considerations are reduced and a layout size of the circuit is reduced. A working principle thereof is as follows. When a clock signal φ is changed from 0 to 1, an internal current sense amplifier of a P-type bulk input current switch logic circuit H10 start to operate, and a full-swing output is performed via the output terminals Q1 and Q2 for transmitting to a next stage N-type bulk input current switch logic circuit H20. When the clock signal φ is changed from 1 to 0, an internal current sense amplifier of a P-type bulk input current switch logic circuit H20 start to operate, and a full-swing output is performed via the output terminals Q1 and Q2 for transmitting to a third stage P-type bulk input current switch logic circuit H30, and so on, until operation of the whole pipeline structure is completed.

In summary, in the present invention, by sensing current, switch of levels transition may be quickly accomplished, and by applying only two serially connected transistors, transmission speed of digital signals may be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A current switch logic circuit, comprising:
   a current sense amplifier, comprising:
      a first transistor, having a gate, a first source/drain and a second source/drain, wherein the first source/drain is coupled to a first voltage, the gate is coupled to a first output terminal, and the second source/drain is coupled to a second output terminal;
      a second transistor, having a gate, a first source/drain and a second source/drain, wherein the first source/drain is coupled to the first voltage, the gate is coupled to the second output terminal, and the second source/drain is coupled to the first output terminal;
      a third transistor, having a gate, a first source/drain and a second source/drain, wherein the first source/drain is coupled to the second output terminal, the gate is coupled to one of a pre-charge enable terminal and the first output terminal; and
      a fourth transistor, having a gate, a first source/drain and a second source/drain, wherein the first source/drain is coupled to the first output terminal, the gate is coupled to one of a pre-charge enable terminal and the second output terminal; and
   a logic tree, coupled between the second source/drain of the third transistor and the second source/drain of the fourth transistor, and having a first control terminal and a second control terminal, wherein the second control terminal is coupled to one of the pre-charge enable terminal and the first output terminal, and the first control terminal is coupled to one of the pre-charge enable terminal and the second output terminal.

2. The current switch logic circuit as claimed in claim 1, wherein the logic tree is used for generating a first current and a second current, the current sense amplifier generates a first output signal at the first output terminal and a second output signal at the second output terminal according to the first current and the second current.

3. The current switch logic circuit as claimed in claim 2 further comprising:
a seventh transistor, having a gate, a first source/drain and a second source/drain, wherein the first source/drain is coupled to the first voltage, the second source/drain is coupled to the second output terminal, and the gate is coupled to the pre-charge enable signal; and
an eighth transistor, having a gate, a first source/drain and a second source/drain, wherein the first source/drain is coupled to the first voltage, the second source/drain is coupled to the first output terminal, and the gate is coupled to the pre-charge enable signal,
wherein the seventh transistor and the eighth transistor are used for respectively pre-charge the second output signal and the first output signal to the first voltage when the pre-charge signal is enabled.

4. The current switch logic circuit as claimed in claim 3, wherein the seventh transistor and the eighth transistor are P-type transistors.

5. The current switch logic circuit as claimed in claim 2 further comprising:
a ninth transistor, having a gate, a first source/drain and a second source/drain, wherein the first source/drain is coupled to the second voltage, the second source/drain is coupled to the second output terminal, and the gate is coupled to the pre-charge enable signal; and
a tenth transistor, having a gate, a first source/drain and a second source/drain, wherein the first source/drain is coupled to the second voltage, the second source/drain is coupled to the first output terminal, and the gate is coupled to the pre-charge enable signal,
wherein the ninth transistor and the tenth transistor are used for respectively pre-charging the second output signal and the first output signal to the second voltage when the pre-charge enable signal is enabled.

6. The current switch logic circuit as claimed in claim 5, wherein the ninth transistor and the tenth transistor are N-type transistors.

7. The current switch logic circuit as claimed in claim 1, wherein the logic tree comprises:
at least a fifth transistor having a gate, a first source/drain, a second source/drain and a base, wherein the first source/drain is coupled to the second source/drain of the third transistor, the gate is coupled to the first control terminal, the base is used for receiving a first input signal, and the second source/drain is coupled to the second voltage; and
at least a sixth transistor having a gate, a first source/drain, a second source/drain and a base, wherein the first source/drain is coupled to the second source/drain of the fourth transistor, the gate is coupled to the second control terminal, the base is used for receiving a second input signal, and the second source/drain is coupled to the second voltage,
wherein when a number of the fifth transistors exceeds one, the fifth transistors are connected in parallel, and when a number of the sixth transistors exceeds one, the sixth transistors are connected in parallel.

8. The current switch logic circuit as claimed in claim 1, wherein the first transistor and the second transistor are P-type transistors, and the third transistor, the fourth transistor, the fifth transistor and the sixth transistor are N-type transistors, the first voltage is a system voltage, and the second voltage is a ground voltage.

9. The current switch logic circuit as claimed in claim 1, wherein the first transistor and the second transistor are N-type transistors, and the third transistor, the fourth transistor, the fifth transistor and the sixth transistor are P-type transistors, the first voltage is a ground voltage, and the second voltage is a system voltage.

10. The current switch logic circuit as claimed in claim 9 further comprising at least an boost circuit having a first input terminal, a second input terminal and an output terminal, wherein the first input terminal is used for receiving a third input signal, the second input terminal is used for receiving a fourth input signal, and the output terminal outputs the first input signal or the second input signal, wherein the boost circuit comprises:
a capacitor, having a first terminal and a second terminal, wherein the first terminal is coupled to the first input terminal of the boost circuit;
a first switch, having an input terminal, an output terminal and an enable terminal, wherein the input terminal is coupled to the first input terminal of the boost circuit, and the enable terminal is coupled to the second input terminal of the boost circuit;
a second switch, having an input terminal, an output terminal and an enable terminal, wherein the input terminal is coupled to the second terminal of the capacitor, the enable terminal is coupled to the second input terminal of the boost circuit, and the output terminal is coupled to the output terminal of the first switch; and
a tenth transistor, having a gate, a first source/drain and a second source/drain, wherein the gate is coupled to the output terminal of the second switch, the first source/drain and the second terminal of the capacitor are coupled to the output terminal of the boost circuit, and the second source/drain is coupled to a third voltage,
wherein the boost circuit enables/disables the first switch and the second switch according to the fourth signal, and boosts the third signal via the capacitor to generate the second input signal and the fourth input signal.

11. The current switch logic circuit as claimed in claim 10, wherein the tenth transistor is an N-type transistor, and the third voltage is the ground voltage.

12. The current switch logic circuit as claimed in claim 10, wherein the tenth transistor is an N-type transistor, and the third voltage is the system voltage.

13. A current switch logic circuit, comprising:
a current sense amplifier, comprising:
a first transistor, having a gate, a first source/drain and a second source/drain, wherein the first source/drain is coupled to a first voltage, the gate is coupled to a first output terminal, and the second source/drain is coupled to a second output terminal;
a second transistor, having a gate, a first source/drain and a second source/drain, wherein the first source/drain is coupled to the first voltage, the gate is coupled to the second output terminal, and the second source/drain is coupled to the first output terminal;
a third transistor, having a gate, a first source/drain and a second source/drain, wherein the gate is coupled to one of a pre-charge enable terminal and the first output terminal, and the second source/drain is coupled to a second voltage; and
a fourth transistor, having a gate, a first source/drain and a second source/drain, wherein the gate is coupled to one of a pre-charge enable terminal and the second output terminal, and the second source/drain is coupled to the second voltage; and a logic tree, coupled between the first source/drain of the third transistor, the first source/drain of the fourth transistor, the first output terminal and the second output terminal, and having a first control terminal and a second control terminal, wherein the second control terminal is coupled to one of the pre-charge enable terminal and the first output terminal, and the first control terminal is coupled to one of the pre-charge enable terminal and the second output terminal.

14. The current switch logic circuit as claimed in claim 13, wherein the logic tree is used for generating a first current and a second current, the current sense amplifier generates a first output signal at the first output terminal and a second output signal at the second output terminal according to the first current and the second current.

15. The current switch logic circuit as claimed in claim 14 further comprising:

a seventh transistor, having a gate, a first source/drain and a second source/drain, wherein the first source/drain is coupled to the first voltage, the second source/drain is coupled to the second output terminal, and the gate is coupled to the pre-charge enable signal; and an eighth transistor, having a gate, a first source/drain and a second source/drain, wherein the first source/drain is coupled to the first voltage, the second source/drain is coupled to the first output terminal, and the gate is coupled to the pre-charge enable signal, wherein the seventh transistor and the eighth transistor are used for respectively pre-charging the second output signal and the first output signal to the first voltage when the pre-charge signal is enabled.

16. The current switch logic circuit as claimed in claim 15, wherein the seventh transistor and the eighth transistor are P-type transistors.

17. The current switch logic circuit as claimed in claim 14 further comprising:

a ninth transistor, having a gate, a first source/drain and a second source/drain, wherein the first source/drain is coupled to the second voltage, the second source/drain is coupled to the second output terminal, and the gate is coupled to the pre-charge enable signal; and a tenth transistor, having a gate, a first source/drain and a second source/drain, wherein the first source/drain is coupled to the second voltage, the second source/drain is coupled to the first output terminal, and the gate is coupled to the pre-charge enable signal, wherein the ninth transistor and the tenth transistor are used for respectively pre-charging the second output signal and the first output signal to the second voltage when the pre-charge enable signal is enabled.

18. The current switch logic circuit as claimed in claim 17, wherein the ninth transistor and the tenth transistor are N-type transistors.

19. The current switch logic circuit as claimed in claim 13, wherein the logic tree comprises:

at least a fifth transistor having a gate, a first source/drain, a second source/drain and a base, wherein the first source/drain is coupled to the second source/drain of the third transistor, the gate is coupled to the first control terminal, the base is used for receiving a first input signal, and the second source/drain is coupled to the second voltage; and at least a sixth transistor having a gate, a first source/drain, a second source/drain and a base, wherein the first source/drain is coupled to the second source/drain of the fourth transistor, the gate is coupled to the second control terminal, the base is used for receiving a second input signal, and the second source/drain is coupled to the second voltage, wherein when a number of the fifth transistors exceeds one, the fifth transistors are connected in parallel, and when a number of the sixth transistors exceeds one, the sixth transistors are connected in parallel.

20. The current switch logic circuit as claimed in claim 13, wherein the first transistor and the second transistor are P-type transistors, and the third transistor, the fourth transistor, the fifth transistor and the sixth transistor are N-type transistors, the first voltage is a system voltage, and the second voltage is a ground voltage.

21. The current switch logic circuit as claimed in claim 13, wherein the first transistor and the second transistor are N-type transistors, and the third transistor, the fourth transistor, the fifth transistor and the sixth transistor are P-type transistors, the first voltage is a ground voltage, and the second voltage is a system voltage.

22. The current switch logic circuit as claimed in claim 13 further comprising at least an boost circuit having a first input terminal, a second input terminal and an output terminal, wherein the first input terminal is used for receiving a third input signal, the second input terminal is used for receiving a fourth input signal, and the output terminal outputs the first input signal or the second input signal, wherein the boost circuit comprises:

a capacitor, having a first terminal and a second terminal, wherein the first terminal is coupled to the first input terminal of the boost circuit;

a first switch, having an input terminal, an output terminal and an enable terminal, wherein the input terminal is coupled to the first input terminal of the boost circuit, and the enable terminal is coupled to the second input terminal of the boost circuit;

a second switch, having an input terminal, an output terminal and an enable terminal, wherein the input terminal is coupled to the second terminal of the capacitor, the enable terminal is coupled to the second input terminal of the boost circuit, and the output terminal is coupled to the output terminal of the first switch; and a tenth transistor, having a gate, a first source/drain and a second source/drain, wherein the gate is coupled to the output terminal of the second switch, the first source/drain and the second terminal of the capacitor are coupled to the output terminal of the boost circuit, and the second source/drain is coupled to a third voltage, wherein the boost circuit enables/disables the first switch and the second switch according to the fourth signal, and boosts the third signal via the capacitor to generate the second input signal and the fourth input signal.

23. The current switch logic circuit as claimed in claim 22, wherein the tenth transistor is an N-type transistor, and the third voltage is the ground voltage.

24. The current switch logic circuit as claimed in claim 22, wherein the tenth transistor is an N-type transistor, and the third voltage is the system voltage.

* * * * *